(12) United States Patent
Otsuka

(10) Patent No.: US 7,333,374 B2
(45) Date of Patent: Feb. 19, 2008

(54) SEMICONDUCTOR MEMORY DEVICE CAPABLE OF REPLACING DEFECTIVE MEMORY CELL WITH REDUNDANT MEMORY CELL, AND ELECTRONIC EQUIPMENT

(75) Inventor: Eitaro Otsuka, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 205 days.

(21) Appl. No.: 11/178,336

(22) Filed: Jul. 12, 2005

(65) Prior Publication Data

US 2006/0044898 A1    Mar. 2, 2006

(30) Foreign Application Priority Data

Aug. 31, 2004    (JP)    ............... 2004-251510

(51) Int. Cl.
*G11C 7/00* (2006.01)
*G11C 29/00* (2006.01)

(52) U.S. Cl. ...................... 365/200; 365/222
(58) Field of Classification Search ............... 365/222, 365/200
See application file for complete search history.

(56) References Cited

U.S. PATENT DOCUMENTS

| | | | |
|---|---|---|---|
| 5,625,596 A | | 4/1997 | Uchida |
| 5,889,727 A | * | 3/1999 | Hsu et al. ............... 365/233 |
| 6,762,963 B2 | * | 7/2004 | Inoue et al. ............. 365/200 |
| 6,956,777 B2 | * | 10/2005 | Komura et al. .......... 365/200 |

* cited by examiner

*Primary Examiner*—Amir Zarabian
*Assistant Examiner*—Michael Weinberg
(74) *Attorney, Agent, or Firm*—Oliff & Berridge, PLC

(57) ABSTRACT

A semiconductor memory device comprises: a memory cell array having a standard memory cell array part in which dynamic memory cells are arranged in a matrix pattern, and a redundant memory cell array having a redundant memory cell set up to replace a defective memory cell in the standard memory cell array part; an access control part controlling external access operation and refresh access operation regarding the memory cell array; and a redundancy judgment circuit executing redundancy judgment to determine whether the memory cell which is a subject to the external access operation or the refresh access operation is the redundant memory cell or not, controlling so as to access the redundant memory cell, if the subjected memory cell is the redundant memory cell, and controlling so as to access the memory cell in the standard memory cell array, if the subjected memory cell is not the redundant memory cell. In case of executing the redundancy judgment for the refresh access operation by the redundancy judgment circuit and the refresh access operation according to generation of a refresh access request indicating the start of the refresh access operation, if the external access request indicating the start of the external access operation generates during the time from start of redundancy judgment for the refresh access operation until completion of the refresh access operation, the access control part makes the redundancy judgment circuit execute the redundancy judgment for the external access operation in parallel to the refresh access operation, and execute the external access operation after completion of the refresh access operation.

6 Claims, 14 Drawing Sheets

| | #CS | REFRESH MODE (NOTE) |
|---|---|---|
| OPERATION MODE | L | MODE 1 |
| STANDBY | H | MODE 2 |

(NOTE)
REFRESH MODE 1: A REFRESH IS EXECUTED AFTER A REFRESH TIMING SIGNAL IS GENERATED INSIDE A MEMORY CHIP AND WHEN AN EXTERNAL ACCESS IS IN NO STATE OF EXECUTION.

REFRESH MODE 2: A REFRESH IS EXECUTED IN RESPONSE TO A REFRESH TIMING SIGNAL GENERATED INSIDE A MEMORY CHIP (ADDRESS INPUTTING NOT REQUIRED)

COMPARISON EXAMPLE

FIRST EMBODIMENT

FIRST EMBODIMENT

SECOND EMBODIMENT

SEMICONDUCTOR MEMORY DEVICE CAPABLE OF REPLACING DEFECTIVE MEMORY CELL WITH REDUNDANT MEMORY CELL, AND ELECTRONIC EQUIPMENT

This application claims the benefit of Japanese Patent Application No. 2004-251510, filed Aug. 31, 2004. The entire disclosure of the prior application is hereby incorporated by reference herein in its entirely.

BACKGROUND

The present invention relates to a semiconductor memory device having memory cells alley in which dynamic memory cells are arranged in a matrix pattern, and particularly, to a semiconductor memory device capable of replacing a defective memory cell with a redundant memory cell.

As a semiconductor memory device which is developed to include advantages of both a DRAM and an SRAM, a virtual SRAM (also referred to as VSRAM, Virtually Static Ram) is known. While a pseudo SRAM (PSRAM, Pseudo Static RAM) is provided with a memory cells array including dynamic memory cells in the same way as a DRAM, it is built in with a refresh timer, executing an internal refresh operation. Consequently, an external device connected to the virtual SRAM (for example, CPU) is able to access (reading and writing data) the virtual SRAM without being conscious of the refresh operation.

Further, in the semiconductor memory device, there is generally employed redundant technology which improves production yield of the semiconductor memory device by providing beforehand a spare memory cell called a redundant memory cell and replacing a defective memory cell, which occurred in a normal memory cell array, with this redundant memory cell. This is adopted in the virtual SRAM described above.

It should be noted that in regard to the redundant technology for the semiconductor memory device, for example, it is described in the following patent document.

Japanese Unexamined Patent Publication No. Hei8-83495 is an example of related art.

On the other hand, making further improvement of yield is desired in the semiconductor memory device. However, use of the redundant technology so as to provide simply more redundant memory cells creates a problem in terms of operating speed as described as follows.

FIG. 17 is a diagram explaining a flow of access processing in a virtual SRAM using the redundant technology. As shown in FIG. 17A, corresponding to an input to an un-illustrated chip select and an external address, an address transition signal ATD (ATD signal) inside the virtual SRAM generates, and in response to this, an external access request signal RQF is generated. When the external access request signal RQF generates, the external access execution signal ACTF is generated executing external accessing.

In this external access, execution is made in order of redundancy judgment, activation and inactivation of a word line (WL). In this redundancy judgment, it is determined whether or not an address concerned is what corresponds to a redundant memory cell replaced. If it corresponds, an address corresponding to the redundant memory cell replaced is outputted. Further, as shown in FIG. 17B, when a refresh request signal RQR generates, a refresh execution signal ACTR generates in response, and a refresh access is executed.

This refresh access, too, is executed in order of redundancy judgment, activation and inactivation of a word line (WL). Note, however, that as shown in FIG. 17C, if the external access request signal RQF generates during execution of the refresh access, upon completion of the refresh access, the external access execution signal ACTF generates to execute the external access.

It should be noted that patched sections in the diagrams show time settings for address to carry out redundancy judgment and time settings of address corresponding to the world line (WL).

An access time Tac of the virtual SRAM is generally based on the chip select and the input to the external address. But since the ATD signal is an address transition signal generating in response to the input to the chip address and the external address, it is proper to use the time of ATD signal generation as a criterion inside the virtual SRAM.

When it is shown in FIG. 17A, redundancy judgment time for the external access is included in the access time Tac. Further, when it is shown in FIG. 17C, the redundancy judgment time for refresh access and the redundancy judgment time for external access are included in the access time Tac. As a result, when it is desired to increase yield by setting up more redundant memory cells, increasing the items subject to redundancy judgment will increase time for redundancy judgment, thus extending the access time.

Especially, in case of FIG. 17C, since time for redundancy judgment twice is included in the access time Tac, the problem becomes more complicated. Further, since external accessing is carried out after completion of the refresh access, time for waiting for the completion of the refresh access is added further to prolong the access time.

As described above, there is a problem that although it is possible to improve yield by setting up more redundant memory cells in the virtual SRAM, it results in extending the access time, thus making it impossible to improve the operating speed. Further, this problem is a common problem not only relating to the virtual SRAM but also to a semiconductor memory device where memory cell arrays of memory cells of the dynamic type are arranged in the matrix pattern.

SUMMARY

An advantage of the invention is to provide technology which can improve yield and the operating speed by setting up more redundant memory cells in the semiconductor memory device such as pseudo SRAM.

According to a first aspect of the invention, a first semiconductor memory device includes: a memory cell array having a standard memory cell array part in which memory cells of a dynamic type are arranged in a matrix pattern, and a redundant memory cell array having a redundant memory cell set up to replace a defective memory cell in the standard memory cell array part; an access control part controlling external access operation and refresh access operation regarding the memory cell array; and a redundancy judgment circuit executing redundancy judgment to determine whether a memory cell concerned subject to the external access operation or the refresh access operation is the redundant memory cell or not, so that if the memory cell concerned should be the redundant memory cell, control is provided such that the redundant memory cell may be accessed, whereas if the memory cell concerned should not be the redundant memory cell, control is provided such that the memory cell in the standard memory cell array may be accessed. In case of executing the redundancy judgment for the refresh access operation by the redundancy judgment circuit and the refresh access operation according to generation of a refresh access request indicating that the refresh access operation be started, if the external access request indicating that the external access operation should be started generates during the time from start of the redundancy judgment for the refresh access operation until completion of the refresh access operation, the access control part makes the redundancy judgment for the external access operation to be executed by the redundancy judgment circuit in parallel to the refresh access operation, executing the external access operation after completion of the refresh access operation.

According to the semiconductor memory device, by carrying out the redundancy judgment for the external access operation in parallel while the refresh access operation is being executed, it is possible to execute the external access operation after completion of the refresh access operation. Hence, it is possible to shorten access time by a portion of the redundancy judgment for the external access operation. This enables yield of the semiconductor device to improve by setting up more redundant memory cells and the operating speed to increase.

Now, it is preferable that if the external access request generates while the redundancy judgment for the refresh access operation is being executed, the access control part stops the redundancy judgment for the refresh access operation, that after the redundancy judgment for the external access operation by the redundancy judgment circuit is executed according to generation of the external access request, the external access operation is executed, while at the same time, the redundancy judgment for the refresh access operation is again executed by the redundancy judgment circuit in parallel to the external access operation, so that the refresh access operation is executed after completion of the external access operation.

According to the first semiconductor memory device, if the external access request generates while the redundancy judgment for the refresh access operation is being executed, the external access operation can be executed in preference to the refresh access operation, hence, the access time can be further shortened. This enables yield of the semiconductor device to improve and the operating speed to increase by setting up more redundant memory cells.

Further, according to a second aspect of the invention, a semiconductor memory device includes: a memory cell array including a standard memory cell array part in which memory cells of a dynamic type are arranged in a matrix pattern and a redundant memory cell array having a redundant memory cell set up replacing a defective memory cell in the standard memory cell array part; an access control part controlling an external access operation and a refresh access operation with respect to the memory cell array; and a redundancy judgment circuit executing redundancy judgment to determine whether a memory cell subject to the external access operation or the refresh access operation is the redundant memory cell, so that if the memory cell concerned should be the redundant memory cell, control is provided such that the redundant memory cell may be accessed, whereas if the memory cell concerned should not be the redundant memory cell, control is provided such that the memory cell in the standard memory cell array may be accessed. In case of executing redundancy judgment for the refresh access operation by the redundancy judgment circuit according to generation of a refresh access request indicating that the refresh access operation should be started, if the external access request indicating that the external access operation be started should generate during the time from the redundancy judgment for the refresh access operation is started until the refresh access operation is completed, the redundancy judgment for the external access operation by the redundancy judgment circuit and the external access operation are executed.

According to the second aspect of the invention, if the external access request generates while the redundancy judgment for the refresh access operation is being executed, the external access operation can be executed in preference to the refresh access operation, hence, the access time can be further shortened. In the same way as the first aspect of the invention, this enables yield of the semiconductor device to improve and the operating speed to increase by setting up more redundant memory cells.

It should be noted that the invention can be realized in various forms. For example, it may be realized in terms of such mode as semiconductor memory device, access control method of the semiconductor memory device, and electronic equipment equipped with a semiconductor memory device.

BRIEF DESCRIPTION OF THE DRAWINGS

The invention will be described with reference to the accompanying drawings, wherein like numbers refer to like elements, and wherein.

DETAILED DESCRIPTION OF EMBODIMENTS

Figures 1, 2:
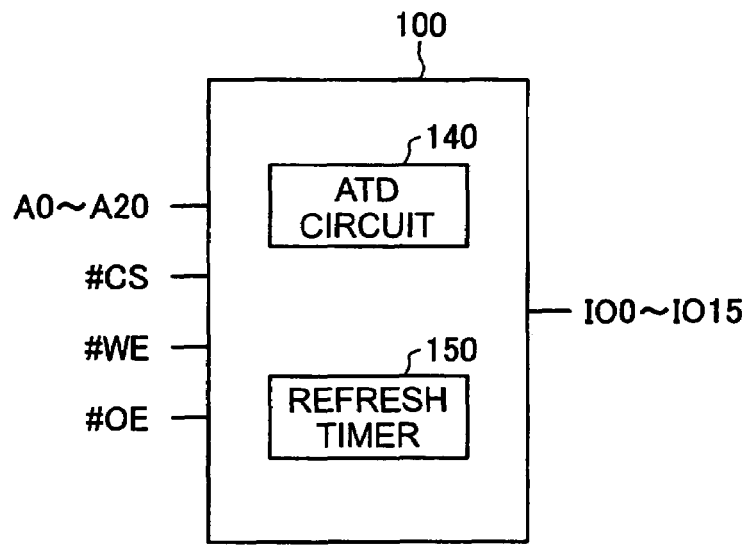
FIG. 1 is an explanatory diagram showing a terminal configuration of a memory chip 100 as a embodiment of a semiconductor memory device of the invention.
FIG. 2 is an explanatory diagram showing the division of operated condition of a memory chip 11 as a embodiment of a semiconductor device of the invention.

Next, embodiments of the invention will be described based on actual examples in the following order.
A. Terminal Configuration of a Semiconductor Memory Device and Operated Condition in Outline
B. First Embodiment
B1. Configuration of the Inside of a Semiconductor Memory Device
B2. Operation in Operation Mode
B2. 1. Case of Normal Read Access
B2. 2. Case of Normal Refresh Access
B2. 3. Case of Refresh Access and Read Access Consecutively Executed
B3. Effect of First Embodiment
C. Second Embodiment
C1. Case of Refresh Access and Read Access Consecutively Executed
C2. Effect of Second Embodiment
D. Application Embodiments to Electronic Equipment
E. Modification
A. Terminal Configuration of a Semiconductor Memory Device and Outline of Operated Condition FIG. 1 is an explanatory diagram showing terminal configuration of a memory chip 100 as an example of a semiconductor memory device of the invention. The memory chip has following terminals.

A0 to A20: Address input terminal (21 pieces)
CS: Chip select input terminal
WE: Light enable input terminal
OE: Output enable input terminal
IO0 to IO15: Input/output data terminal (16 pieces)

It should be noted that in the following explanation, the same reference numerals refer to the terminal names and the signal names. Those terminal names (signal names) prefixed with "#" stand for negative logic. While a plurality of terminals are provided respectively for address input terminal A0-A20 and input/output data terminals IO0 to 1015, they are illustrated in simplified forms in FIG. 1. Further, other terminals not particularly necessary in the following description of power terminals and the like are omitted.

This memory chip 100 is configured as a virtual SRAM (VSRAM) which can be accessed in the same procedures as a normal asynchronous SRAM. However, unlike the SRAM, dynamic type memory cells are used, so that a refresh is required within a preset period. Consequently, inside the memory chip 100 is built in a refresh timer 150.

In this specification, a read or write operation of data from the external device (control) is called an "external access" or simply "access," whereas a refresh access operation through a refresh controller is called a "refresh access" or simply a "refresh." Further, there is a case of abbreviating refresh as an "RF."

Inside the memory chip 100, there is provided an address transition detection circuit 140 for detecting if any of the inputted addresses A0-A20 exhibits a change exceeding 1 bit. And a circuit inside the memory chip 100 operates based on an address transition signal supplied from the address transition detection circuit 140. This address transition signal corresponds to an external access timing signal of the invention.

It should be noted that in the following explanation, the address transition detection circuit 140 is called an "ATD circuit," and an address transition signal ATD (external access timing signal) is also called an "ATD signal."

A chip select signal #CS shown in FIG. 1 is a signal to control the operated condition of the memory chip 100. FIG. 2 is an explanatory diagram showing divisions of the operated condition of the memory 100 corresponding to a signal level of the chip select signal #CS. It should be noted that in this specification, "H level" means a "1" level of two levels of a 2-value signal, and "L" level means an "0" level.

When the chip select signal #CS is at L level (active), the inside operated condition becomes operation mode, and a read/write operation cycle (hereinafter simply referred to as an "operation cycle" or a "read/write cycle") is carried on. In the operation cycle, execution of the external access is possible, and the refresh access is executed as necessary.

When the chip select signal #CS is at H level (active), inside operated condition becomes standby mode. In the standby mode, since execution of the external access is prohibited, all word lines are considered in an inactivated condition. However, when the refresh access is executed, a word line specified by a refresh address is activated.

It should be noted that the refresh access is such that operation mode is executed according to a first refresh mode, while standby mode is executed according to a second refresh mode. In the first refresh mode, after the refresh timer 150 generates a refresh timing signal and when neither of the read access or the write access is executed (when the external access is not executed), the refresh access is started.

On the other hand, in the second refresh mode, upon generation of the refresh timing signal, the refresh access immediately commences. In this manner, the memory chip 100 executes the refresh access according to the refresh mode which respectively suits the two operated conditions.

The addresses A0 to A20 shown in FIG. 1 are in 21 bits and specify an address of 2M words. Further, the input/output data IO0-IO15 is 16-bit data of 1 word. Namely, one value of the addresses A0 to A20 corresponds to 16 bits (1 word), and can input/output 16-bit input/output data IO0-IO15 at one time.

In operation mode, when a write enable signal #WE become L level, it is determined to be a write cycle, and when it becomes H level, it is determined to be a read cycle. Further, when an output enable signal #OE becomes L level, an output from the input/output data terminals IO0 to IO15 becomes possible.

Figure 3:
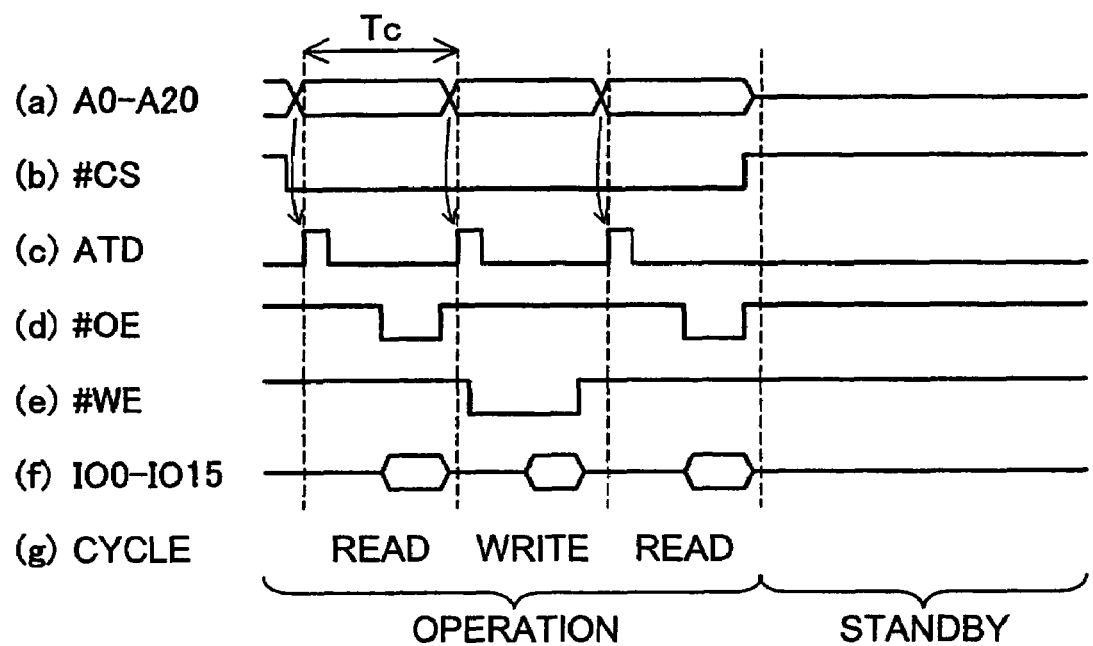
FIG. 3 is a timing chart showing a schema of operation of the memory chip 100.

FIG. 3 is a timing chart showing a schema of operation of the memory chip 100. It is instantly determined corresponding to a change in the chip select signal #CS whether it is either of the two operated conditions (operation mode and standby mode) shown in FIG. 2.

In the first three cycles of FIG. 3, since the chip select signal #CS is L level, the operated condition becomes operation mode, and the operation cycle is executed. In the operation cycle, either a read cycle or a write cycle is executed corresponding to the level of the write enable signal #WE. Further, corresponding to the level of the output enable signal #OE, when L level is reached, the output from the input/output data terminals IO0 to IO15 becomes possible.

It should be noted that a minimum cyle Tc (that is, the minimum cycle of addresses A0 to A20) of the ATD signal corresponds to a cycle time (also referred to as "cycle period"). The cycle time Tc is set to a value in a range from approx. 50 ns to approx. 100 ns in random access.

After completion of a third cycle in FIG. 3, since the chip select signal #CS rose up to H level, it shows a condition where the operated condition is standby mode.

B. First embodiment:

B1. Configuration of the Inside of a Semiconductor Memory Device

Figure 4:
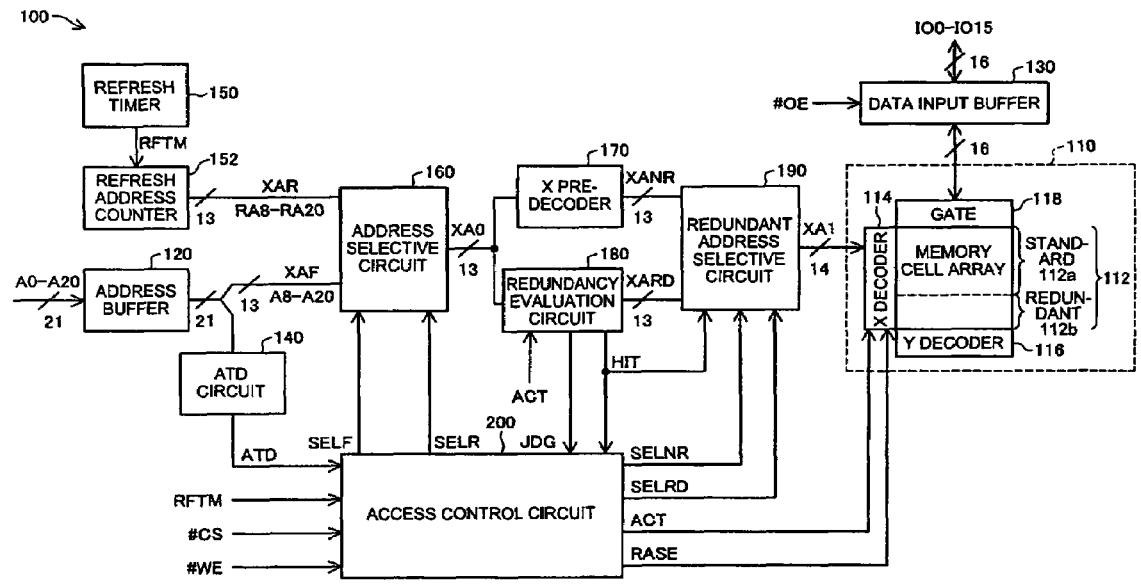
FIG. 4 is a block diagram showing an internal configuration of the memory chip 100.

FIG. 4 is a block diagram showing internal configuration of the memory chip 100. This memory chip 100 is constituted by a memory block 110, an address buffer 120, and a data input/output buffer 130.

The memory block 110 is made up of a memory cell array 112, a row decoder (hereinafter referred to as the "X decoder") 114, a column decoder (hereinafter referred to as the "Y decoder") 116, and a gate block 118.

Configuration of the memory cell 112 is the same as a memory cell array of a typical DRAM. Namely, the memory cell array 112 is what is constituted by a plurality of memory cells of a 1 transistor 1 capacitor type arranged in a matrix pattern. A pair of a word line and a bit line (also called a data line pair) is connected to each memory cell. However, the memory cell array 112 is divided into two blocks of a standard memory cell array part 112a, which corresponds to a normal memory cell array. And a redundant memory cell array part 112b.

It should be noted that in this example, memory cells of 8,192 rows and 256×16 columns (4,096) are arranged in a matrix pattern in the standard memory cell array part 112a, and that memory cells of 128 rows and 256×16 columns (4,096) are arranged in a matrix pattern in the redundant memory cell array part 112b.

The row decoder 114 includes a row driver, selects and activates one line from the plurality of word lines in the memory cell array 112 according to a 14-bit row address (hereinafter also referred to as the "X address") XA1, an access execution signal ACT, and a word line activation signal RASE to be supplied.

The column decoder 116 includes a column driver, selects simultaneously a bit line pair of one word portion (16 bits) from the plurality of bit line pairs according to a column address (hereinafter also referred to as an "Y address") to be supplied.

It should be noted that whether a word line in the standard memory array part 112a or a word line in the redundant memory cell array part 112b is selected according to a highest order bit value of a word line selection X address XA1 of 14 bits. For example, if the highest order bit is "0," a word line in the standard memory cell array part 112a is selected according to a low order 13-bit value. If it is "1," a word line in the redundant memory cell array part 112b is selected according to a low order 7-bit value.

The gate block 118 includes a read circuit and a write circuit, enabling a data exchange between a data input/output buffer 130 and the memory cell array 112. It should be noted that an un-illustrated pre-charge circuit, a sense amplifier and the like are provided in the memory block 110.

The address buffer 120 is a circuit for supplying external addresses (hereinafter simply referred to as the "address") A0 to A20 provided from an external device to other internal circuits. Low order 8-bit addresses A0 to A7 are used as Y addresses, while high order 13-bit addresses A8-A20 are used as an X address XAF. And memory cells of a 1 word portion (16 bits) are selected by the Y addresses A0 to A7 and X addresses A8 to A20 (hereinafter also collectively referred to as the "X address XAS").

1 word data corresponding to the selected memory cells is read or written through the data input/output buffer 130. Namely, the external device can simultaneously access memory cells of the 1 word portion by inputting one address A0 to A20 (hereafter also collectively referred to as the "address ADD").

The memory chip 100 is further made up of an ATD circuit 140, a refresh timer (hereinafter abbreviated as the "RF timer") 150, and a refresh address counter (hereinafter abbreviated as the "RF counter") 152, an address selective circuit 160, an X pre-decoder 170, a redundancy judgment circuit 180, a redundant address selective circuit 190, and an access control circuit 200.

It should be noted that while the memory chip 100 has, in addition to circuits shown in FIG. 4, various circuits such as a control circuit controlling the Y decoder according to the Y addresses A0 to A7 provided by the external device, such circuits are not particularly necessary in terms of describing the invention, hence, omitted in FIG. 4.

The ATD circuit 140 detects whether or not there is a change of over 1 bit in any of the 21-bit addresses A0 to A20 which are supplied from the external device. When the change is detected, an ATD signal in a pulse form as shown in FIG. 3A is generated.

The RF timer 150 generates a refresh timing signal (hereinafter abbreviated as the "RF signal") RFTM per fixed refresh cycle and supplies the signal to the RF counter 152 and the access control circuit 200. It should be noted that the RF timer 150, for example, is constituted by a ring oscillator. The refresh cycle is, for example, set to approx. 32 μs.

Further, the RF counter 152 generates 13-bit refresh addresses (RF addresses) RA8 to RA20 (hereinafter also collectively referred to as the "RF address XAR") synchronously with generation of the RF signal RFTM. For example, when the RF signal RFTM changes from being inactive to being active, an RF address XAR incremented by 1 generates. Further, corresponding to generation or completion of an RF request signal PQR to be explained later, it may be arranged such that the RF address XAR is generated. Further, it is possible to generate this RF address XAR from a 13-bit counter.

The access control circuit 200 generates an access execution signal ACT, a word line activation signal RASE, an external address selective signal SELF, an RF address selective signal SELR, standard address selective signal SELNR and a redundant address selective signal SELRD according to the chip select signal #CS, the ATD signal, the RF signal RFTM, a redundancy judgment completion signal JDG and a redundancy detection signal supplied from the redundancy judgment circuit 180.

Figure 5:
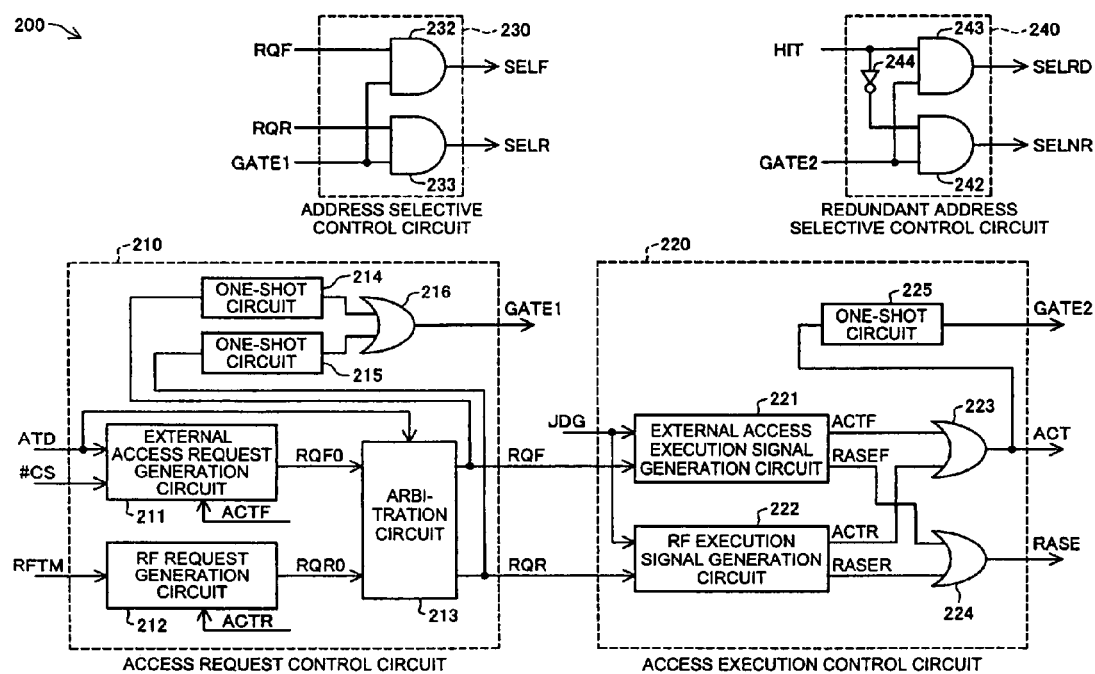
FIG. 5 is a block diagram showing an example of an internal configuration of an access control circuit 200.

FIG. 5 is a block diagram showing an example of internal configuration of an access control circuit 200. The access control circuit 200 comprises an access request control circuit 210, an access execution control circuit 220, an address selective control circuit 230, and a redundant address selective control circuit 240.

The access request control circuit 210 is made up of an external access request generation circuit 211, an RF request generation circuit 212, an arbitration circuit 213, two onreshot circuits 214 and 215, and an OR gate 216 which functions as an address selective gate signal output circuit.

The external access request generation circuit 211 generates a source external access request signal RQFO showing that the external access operation be started corresponding to an ATD signal supplied from the ATD circuit 140. The external access request generation circuit 211, when the chip select signal #CS is active (operation mode), sets the source external access request signal RQFO active synchronously with generation of the ATD signal.

It should be noted that the source external access request signal RQFO is supplied to the arbitration circuit 213.

The RF request generation circuit 212 generates a source RF request signal RQRO according to the RF signal RFTM supplied from the RF timer 150. The RF request generation circuit 212 sets the source RF request signal RQRO active synchronously with generation of the RF signal RFTM. It should be noted that the source RF signal RFTM is supplied to the arbitration circuit 213.

The arbitration circuit 213, when executing external access according to the source external access request signal RQFO, the source RF request signal RQRO, and the ATD signal which are supplied, generates the external access request signal RQF, and, when executing RF access, generates the RF request signal RQR.

Specifically, when the chip select signal #CS is active (operation mode), if the source external access request signal RQFO generates in advance of the source RFD request signal RQRO, the arbitration circuit 213 sets the external access request signal RQF as active, and, if the source RF request signal RQRO generates in advance of the source external request signal RQRO, it sets the RF request signal RQR as active.

Further, if the chip select signal #CS is inactive (standby mode), the arbitration circuit 213 immediately sets the refresh request signal RQR as active according to generation of the refresh request generation signal RQRO. It should be noted that the external access request signal RQF and the RF request signal PQR are supplied to the access execution control circuit 220 and the address selective control circuit 230.

A first one shot circuit 214 generates a 1-shot pulse signal corresponding to the generation of the external access request signal RQF. Likewise, a second one-shot circuit 215 generates a 1-shot pulse signal corresponding to the generation of the RF request signal It should be noted that the first one-shot circuit 214 and the second one-shot circuit 215 will not generate simultaneously the 1-shot pulse signal. A 1-shot pulse signal generated at either 1-shot circuit is outputted as is as an address selective gate signal GATE1 through an OR gate 216. The address selective gate signal GATE1 is supplied to the address selective control circuit 230.

The address selective control circuit 230 comprises two AND gates 232 and 233, and generates an external address selective signal SELF and an RF address selective signal SELR according to the external access request signal RQF, the RF request signal PQR, and the address selective gate signal GATE1.

The external address selective signal SELF is set active ("H" level herein) only while the address selective gate signal GATE1 is generating in case of the external access request signal RQF being active ("H" level herein).

On the other hand, the RF address selective signal SELR is set active ("H" level herein) only while the address selective gate signal GATE1 is generating in case of the RF request signal RQR being active ("H" level herein). It should be noted that the address selective gate signal GATE1 is a 1-shot pulse signal supplied from the access request control circuit 210 as mentioned above. Accordingly, a 1-shot pulse signal generating at the address selective gate signal GATE1 is outputted as is to the external address selective signal SELF and the RF address selective signal SELR.

The access execution control circuit 220 comprises the external access execution signal generation circuit 221, the RF execution signal generation circuit 222, two OR gates 223 and 224, and the one-shot circuit 225.

The external access execution signal generation circuit 221 sets the external access execution signal ACTF as active ("H" level herein) for a fixed period in response to generation of the external access request signal RQF and the redundancy judgment completion signal JDG, while, at the same time, setting also an external access word line activation signal RASEF as active ("H" level herein) for a fixed period.

It should be noted that to insure an inactive period of the word line, an active period of the active access word line activation signal RASEF is set short for a portion of the inactive period of the word line with respect to the active period of the external access execution signal ACTF.

The RF execution signal generation circuit 222 sets the RF execution signal ACTR as active ("H" level herein) for a fixed period in response to the generation of the RF request signal RQR and the redundancy judgment completion signal JDG, while, at the same time, setting an RF access word line activation signal RASER as active ("H" level herein) for a fixed period. It should be noted that the active period of the RF execution signal ACTR and the active period of the RF access word line activation signal RASER are the same as the external access execution signal ACTF and the external access world line activation signal RASEF.

In case of the refresh, it is possible to se the active period of the RF execution signal ACTR and the active period of the RF access word line activation signal RASER shorter than the external access execution signal ACTF and the external access world line activation signal RASEF.

Either of the external access execution signal ACTF and the RF execution signal ACTR is outputted as is as the access execution signal ACT through the first OR gate 223. Further, either of the external access world line activation signal RASEF and the RF access word line activation signal RASER is outputted as is as the word line activation signal RASE through the second OR gate 224. The access execution signal ACT and the word line activation signal RASE are supplied to the X decoder (FIG. 4).

The one-shot circuit 225 generates a 1-shot pulse signal in response to the generation of the access execution signal ACT and outputs it as a redundant address selective gate signal GATE2. The redundant address selective gate signal GATE2 is supplied to the redundant address selective control circuit 240.

The redundant address selective control circuit 240 includes two AND gates 242 and 243, and a NOT gate 244, generating the standard address selective signal SELNR and the redundant address selective signal SELRD corresponding to redundant detection signal HIT and redundant address selective gate signal GATE2. The standard address selective signal SELNR is set as active ("H" level herein) only while the redundant address selective gate signal GATE2 is generating with the redundancy detection signal HIT being inactive ("L" level herein). On the other hand, the redundant address selective signal SELRD is set as active ("H" level herein) only while the redundant address selective gate signal GATE2 is generating with the HIT signal being inactive. It should be noted that the redundant address selective gate signal GATE2 is a 1-shot pulse signal supplied from the access execution control circuit 220 as mentioned above. Hence, the 1-shot pulse signal generating in the redundant address selective gate signal GATE2 is outputted as is to the standard address selective signal SELNR and the redundant address selective signal SELRD.

The address selective circuit 160 (FIG. 4) selects either the external X address XAF or the RF address XAR according to the external address selective signal SELF and the RF address selective signal SELR and supplies it to the X pre-decoder 170 and the redundancy judgment circuit 180 as a selective X address XAO.

Figure 6:
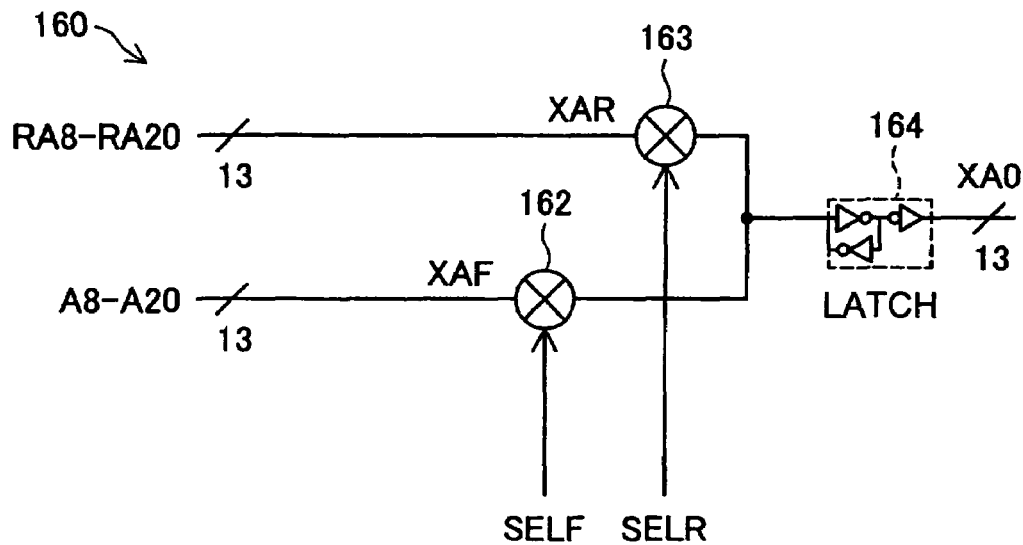
FIG. 6 is a block diagram showing an example of an internal configuration of an address selective circuit 160.

FIG. 6 is a block diagram showing an example of internal configuration of the address selective circuit 160. The address selective circuit 160 is made up of two gates 162 and 163, and a latch 164. The first gate 162 is on only while the external address selective signal SELF is active ("H" level herein), supplying the external X address XAF to the latch 164.

Likewise, the second gate 163 is on only while the RF address selective signal SELR is active ("H" level herein), supplying the RF address XAR to the latch 164. This enables the latch 146 to latch an address supplied while either gate is on during the time two gates 162 and 163 are off and to output it as the selective address XAO.

It should be noted that, as mentioned above, the external address selective signal SELF is a 1-shot pulse signal which generates when executing external access, and the RF address selective signal SELR is a 1-shot pulse signal which generates when executing refresh access. Accordingly, an address supplied when executing each access is latched by the latch 164 and supplied to the X pre-decoder 170 and the redundancy judgment circuit 180 as the selective X address XANR.

The X pre-decoder 170 (FIG. 4) outputs a 13-bit standard X address XANR corresponding to a word line in the standard memory sell array part 112a. The X address XANR is supplied to the redundant address selective circuit 190.

The redundancy judgment circuit 180 determines whether or not the supplied selective address XAO is an address replaced by a redundant address corresponding to a word line in the redundant memory sell array part 112b, and not an address corresponding to a word line in the standard memory cell array part 112a.

If the selective address XAO is an address replaced by a redundant address, the redundant detection signal HIT is changed to active ("H" level herein), while, at the same time, outputting a 13-bit redundant X address XARD corresponding to a word line in the redundant memory sell array part 112b. The redundant detection signal HIT and the redundant X address XARD is supplied to the redundant address selective circuit 190.

It should be noted that as mentioned above, a case where the selective X address XAO is an address replaced by a redundant address is called "a case of having the redundant hit," and a case where the selective X address XAO is an address not replaced by a redundant address is called "a case of having no redundant hit."

Further, as mentioned above, word lines in the redundant memory cell array part 112b in this example number 128 lines, and the number of bits of the redundant X address necessary for selecting 128 word lines is 7 bits. But, a 13-bit redundant X address XARD will be outputted in keeping with the number of bits of the standard X address XANR outputted from the X pre-decoder 170. However, the effective redundant X address is only low order 7 bits. Other bits have no meaning.

The redundant address selective circuit 190 selects either the standard X address XANR or the redundant X address XARD according to the redundant address selective signal SELRD and the standard address selective signal SELNR supplied from the access control circuit 200 and supplies it as a word line selection X address XA1 to the X decoder 114.

Figure 7:
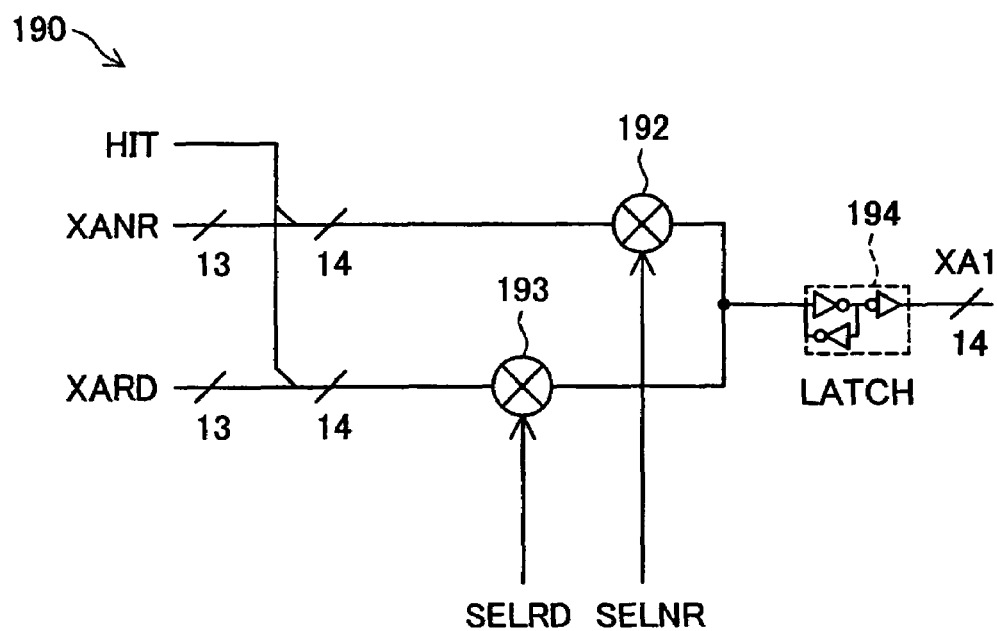
FIG. 7 a block diagram showing an example of an internal configuration of a redundant address selective circuit 190.

FIG. 7 is a block diagram showing an example of internal configuration of the redundant address selective circuit 190. The redundant address selective circuit 190 includes two gates 192 and 193, and a latch 194. The first gate 192 is on only while the standard address selective signal SELNR is active ("H" level herein), supplying the standard X address XANR and the redundancy detection signal HIT to the latch 194.

Likewise, the second gate 193 is on only while the redundant address selective signal SELRD is active ("H" level herein), supplying the redundant address XARD and the redundancy detection signal HIT to the latch 194. This enables the latch 194 to latch an address supplied while either gate is on during the time two gates 192 and 193 are off and to output it as the word line selection address XA1.

It should be noted that, as explained later, the standard address selective signal SELNR is a 1-shot pulse signal which generates when executing an external access or an RF access in case of the redundancy detection signal HIT being inactive, and the redundant address selective signal SELRD is, as explained later, a 1-shot pulse signal which generates when executing an external access or an RF access in case of the redundant detection signal HIT being active.

When the word line selection X address XA1 is being supplied from the redundant address selective circuit 190, the X decoder 114 (FIG. 4) sets one words line corresponding to the word line selection X address XA1 to be an active state according to the access execution signal ACT and the word line activation signal BASE.

B2. Operation in Operation Mode

Operation in operation mode is described below by dividing it to three cases: the normal read access, the refresh access, and the refresh access and the read access being consecutively executed.

B2. 1. Normal Read Access Case

Figure 8:
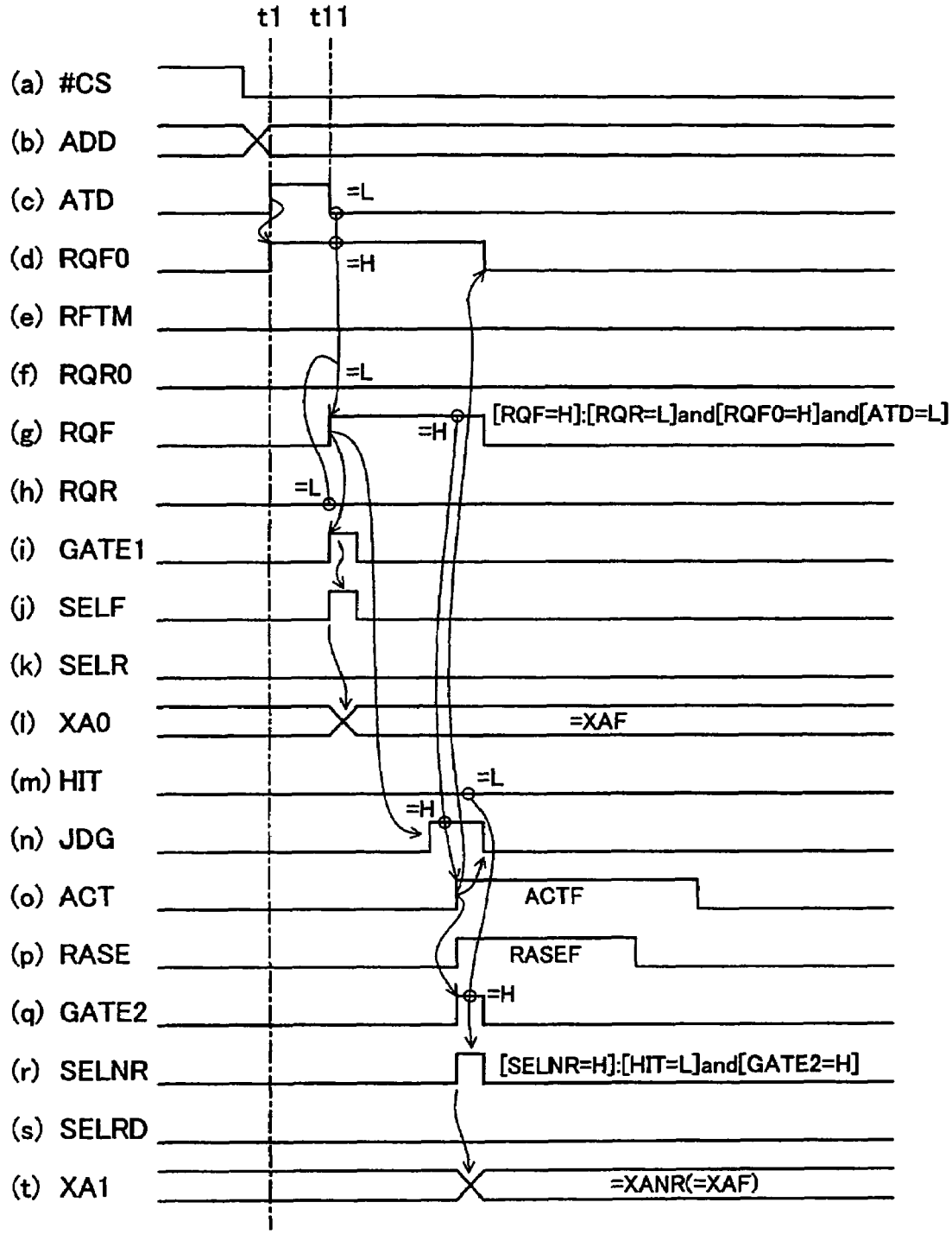
FIG. 8 is a timing chart showing normal read access o9peration in operation mode regarding a case without redundant hit.

FIG. 8 is a timing chart showing the case of normal read access operation in operation mode without redundant hit. It should be noted that when the chip select signal #CS (FIG. 8(a)) is set to L level, it becomes operation mode.

Further, the un-illustrated write enable signal #WE is set to H level (inactive) and the read access is executed. Further, as illustrated, since a rise-up edge is not formed in the RF signal RFTM (FIG. 8(e)), it is assumed that the source RF request signal RQRO (FIG. 8(f)) remains to be L level (inactive), and the RF request signal RQR (FIG. 8(h)) also remains to be L level (inactive).

At time t1, corresponding to a change of the address ADD (A0 to A20), the rise-up edge of the ATD signal (FIG. 8(c)) is formed. And, corresponding to the rise-up edge, the source external access request signal RQFO (FIG. 8(d)) is set to H level (active).

After the source external access request signal RQFO is set to be H level, when the ATD signal trails down to L level at time t11, the external access request signal RQF (FIG. 8(g)) responds to be set to H level (active). It should be noted that the external access request signal RQF is set to H level, provided that the source external access request signal RQFO is at H level, the RF request signal RQR being at L level (inactive) and the ATD signal being at L level.

When the external access request signal RQF is set to H level, a pulse signal which becomes H level (active) for a fixed period responds to be set in the address selective gate signal GATE1 (FIG. 8(i)). Corresponding to a change in the address selective gate signal GATE1, the external address selective signal SELF (FIG. 8(j)) is set to H level (active) for the fixed period. It should be noted that since the RF request signal RQR is not set to H level, the RF address selective signal SELR (FIG. 8(k)) is not set to H level (active).

When the external address selective signal SELF changes to H level for the fixed period, the external X address XAF is set in the selective X address XAO (FIG. 8(l)). And redundancy judgment of the external X address XAF set as the selective X address XAO commences.

Upon completion of the redundancy judgment, the redundancy judgment completion signal JDG (FIG. 8(n)) is set to H level (active). Further, the judgment result is outputted as the redundancy detection signal HIT (FIG. 8(m)). As illustrated, the redundancy detection signal HIT remains to be at L level (inactive), and a case of no redundant hit is shown.

When the redundancy judgment completion signal JDG is set to H level, the un-illustrated external access execution signal ACTF responds to be set to H level (active) during the fixed period and is outputted as the access execution signal ACT (FIG. 8(o)). At the same time, the external access word line activation signal RASEF is set to H level (active) for a fixed period shorter than the external access execution signal ACTF and outputted as the world line activation signal RASE (FIG. 8(p)).

When the access execution signal ACT is set to H level, the redundancy judgment completion signal JDG and the source external access request signal RQWFO respond to be returned to L level (inactive). Further, when the access execution signal ACT is set to H level, a pulse signal which will be at H level (active) for the fixed period responds to be set in the redundant address selective gate signal GATE2 (FIG. 8(q)).

At this time, since the redundancy detection signal HIT is at L level, corresponding to a change in the redundant address selective gate signal GATE2, the standard address selective signal SELNR (FIG. 8(r)) is set to H level (active) for the fixed period, while the redundant address selective signal SELRD (FIG. 8(s)) remains to be at L level (inactive).

When the standard address selective signal SELNR changes to H level for the fixed period, the standard X address XANR, that is, the external X address XAF is set in the word line selection X address XA1 (FIG. 8(t)).

As the foregoing explanation shows, in the normal read access in the case of having no redundant hit, when the access execution signal ACT is set to H level, a word line specified at the external address X address XAF, which is set as the word line selection X address XA1, is activated and the read access is executed with respect to a memory cell specified by the address ADD.

Figure 9:
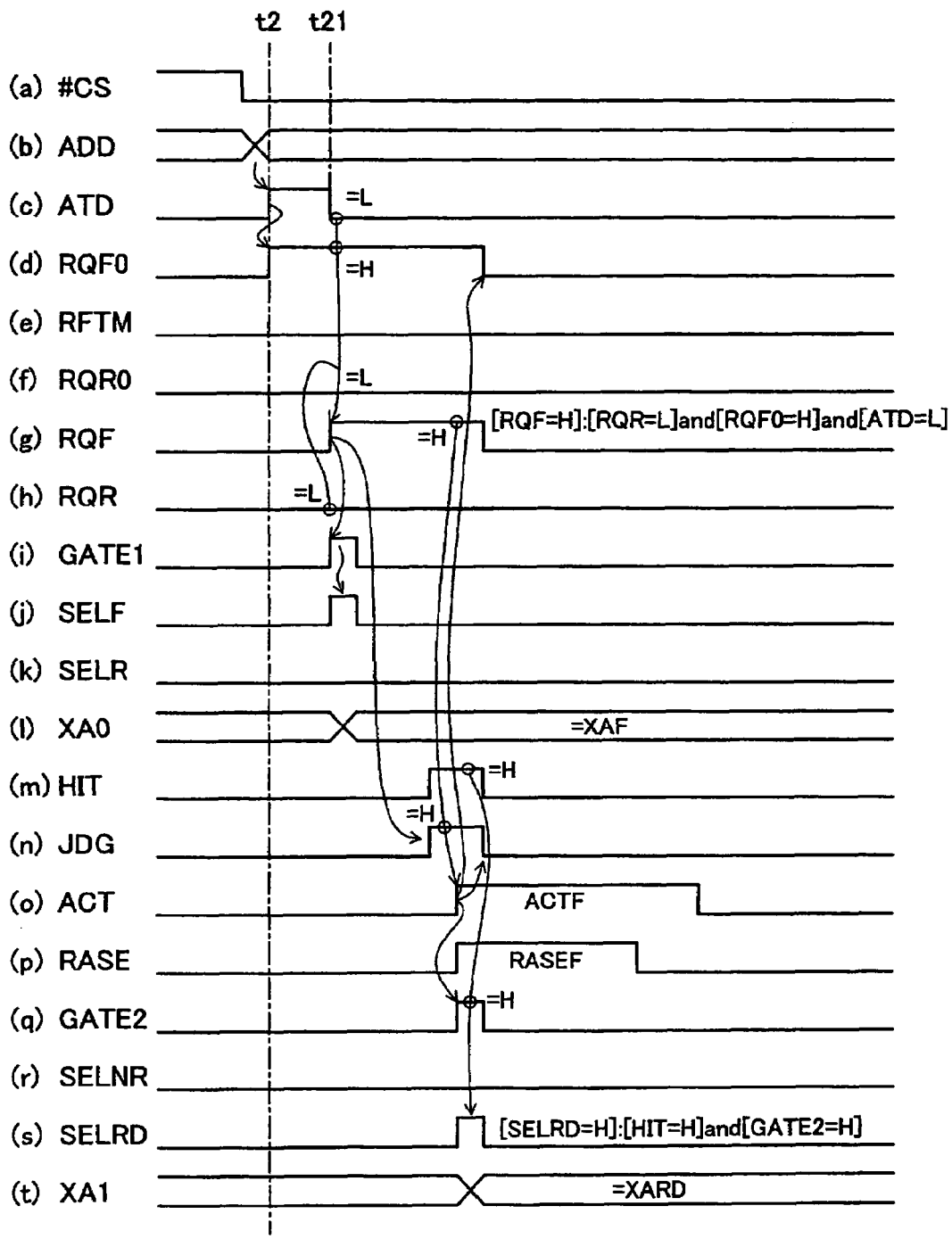
FIG. 9 is a timing chart showing normal read access operation in operation mode regarding a case with redundant hit.

FIG. 9 is a timing chart showing the normal read access operation in operation mode regarding the case of having redundant hit. Operational timing of each signal shown in FIG. 9(a) to FIG. 9(t) is the same as the case of having no HIT (FIG. 8); except for formation of the rise-up edge of the ATD signal (FIG. 9(c)) at time t2 with formation of the trailing edge at time t21; the redundancy detection signal HIT (FIG. 9(m)) changing to H level; and the redundancy address selective signal SELRD (FIG. 9(s)), not the standard address selective signal SELNR (FIG. 9(r)), changing to H level for the fixed period.

These differences will be described in the following.

In the case of having the redundant hit, the redundancy detection signal HIT (FIG. 9(m)) changes to H level (active) at substantially the same timing at which the redundancy judgment completion signal JDG (FIG. 9(n)) changes to H level (active).

When the redundant address selective gate signal GATE2 (FIG. 9(q)) is set to H level (active) for the fixed period, since the redundancy detection signal HIT has changed to H level, the standard address selective signal SELNR (FIG. 9(r)) remains unchanged as L level (non active), and the redundant address selective signal SELRD (FIG. 9(s)) is set to H level (active) for the fixed period corresponding to a change in the redundant address selective gate signal GATE 2.

When redundant address selective signal SELRD changes to H level for the fixed period, the redundant X address XARD is set in the word line selection X address XA1 (FIG. 9(t)).

As the foregoing explanation shows, in the normal read access in the case of having the redundant hit, when the access execution signal ACT is set to H level, a word line for redundancy specified at the redundant address X address XARD, which is set as the word line selection X address XA1, is activated and the read access is executed with respect to a redundant memory cell specified by the redundant address XARD and Y addresses A0 to A8.

B2. 2. Case of Normal Refresh Access

Figure 10:
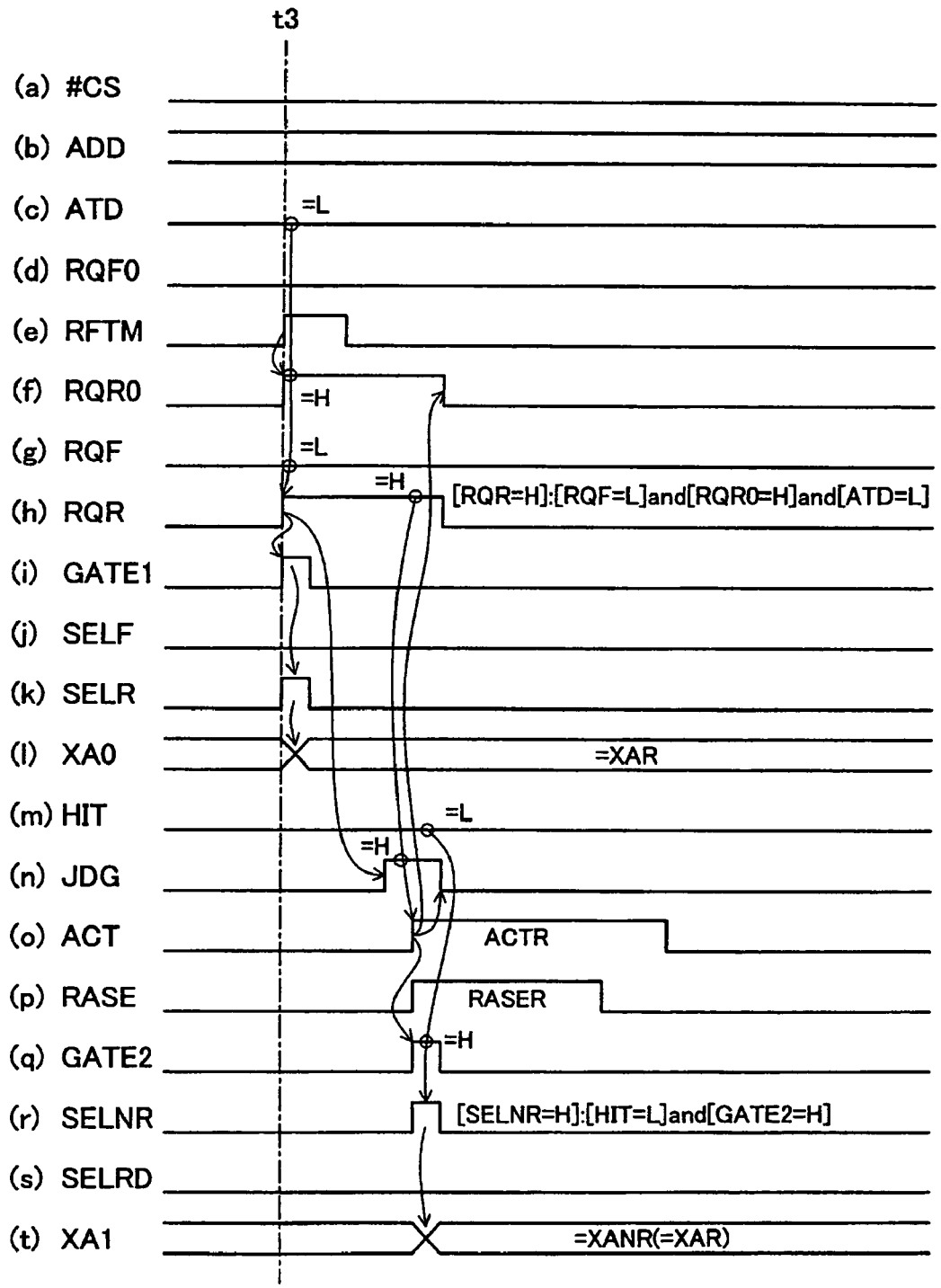
FIG. 10 is a timing chart showing normal refresh access operation in operation mode regarding the case without redundant hit.

FIG. 10 is a timing chart showing the case of normal refresh access operation in operation mode without redundant hit. It should be noted that as described above, in operation mode, the chip select signal #CS (FIG. 10(a)) is set to L level. Further, description will be provided, under the assumption there is no change in the address ADD (FIG. 10(b)) because of explaining the refresh access; since a rise-up edge is not formed in the ATD signal (FIG. 10(c)), L level remains as it is; the source access request signal RQFO remains to be L level (inactive); and the external access request signal RQF remains to be L level (inactive).

At time t3, the rise-up edge of the RF signal RFTM (FIG. 10(e)) is formed. Corresponding to the rise-up edge of the RF signal RFTM, the source RF request signal RQRO (FIG. 10(f)) is set to H level (active).

When the source RF request signal RQRO is set to H level, in case of the ATD signal being at L level, in immediate response, the RF request signal RQR (FIG. 10(h)) is set to H level (active). It should be noted that the RF request signal RQR is set to H level, provided that the source RF request signal RQRO is at H level, the external access request signal RQF is at Level (inactive), and the ATD signal is at L level.

When the RF request signal RQR is set to H level, a pulse signal which becomes H level (active) for the fixed period responds to be set in the address selective gate signal GATE1 (FIG. 10(i)). Corresponding to a change in the address selective gate signal GATE1, the RF address selective signal SELR (FIG. 10(k)) is set to H level (active) for the fixed period. It should be noted that since the external request signal RQF is not set to H level, the external address selective signal SELF (FIG. 10(j)) is not set to H level (active).

When the RF address selective signal SELR changes to H level for the fixed period, the RF address XAR is set in the selective X address XAO (FIG. 10(l)). And, redundancy judgment of the RF address XAR, which is set as the selective X address XAO, commences.

Upon completion of the redundancy judgment, the redundancy judgment completion signal JDG (FIG. 10(n)) is set to H level (active). Further, the judgment result is outputted as the redundancy detection signal HIT (FIG. 10(m)). As illustrated, the redundancy detection signal HIT remains to be at L level (inactive), and the case of no redundant hit is shown.

When the redundancy judgment completion signal JDG is set to H level, the un-illustrated external access execution signal ACTF responds to be set to H level (active) during the fixed period and is outputted as the access execution signal ACT (FIG. 10(o)). At the same time, the RF access word line activation signal RASER is set to H level (active) for a fixed period shorter than the RF access execution signal ACTR and outputted as the world line activation signal RASE (FIG. 10(p)).

When the access execution signal ACT is set to H level, the redundancy judgment completion signal JDG and the source external access request signal RQFO respond to be returned to L level (inactive). Further, when the access execution signal ACT is set to H level, a pulse signal which will be at H level (active) for the fixed period responds to be set in the redundant address selective gate signal GATE2 (FIG. 10(q)).

At this time, since the redundant detection signal HIT is at L level, corresponding to a change in the redundant address selective gate signal GATE2, the standard address selective signal SELNR (FIG. 10(r)) is set to H level (active) for the fixed period, while the redundant address selective signal SELRD (FIG. 10(s)) remains to be at L level (inactive).

When the standard address selective signal SELNR changes to H level for the fixed period, the standard X address XANR, that is, the external X address XAR is set in the word line selection X address XA1 (FIG. 10(t)).

As the foregoing explanation shows, in the normal refresh access for the case of having no redundant hit, when the access execution signal ACT is set to H level, a word line specified at the RF address XAR, which is set as the word line selection X address XA1, is activated and the refresh access is executed.

In the normal refresh access for the case of having the redundant hit, in the same way as the normal read access (FIG. 9), it is the same as the normal refresh access for the case of having no redundant hit (FIG. 8); except the following. Namely, the redundant X address XARD is set in the word line selection X address XA1 by remaining the standard address selective signal SELNR unchanged from L level and the redundant address selective signal SELRD is set to H level (active) for the fixed period corresponding to a change in the redundant address selective gate signal GATE2.

Further, when the chip select signal #CS is set to H level (inactive), standby mode is entered. In this case, generation of the source external access request signal RQFO is prohibited, so that only the refresh access is executed at the same timing as the normal refresh access in the above-mentioned operation mode.

B2. 3. Case of Refresh Access and Read Access Consecutively Executed

Figure 11:
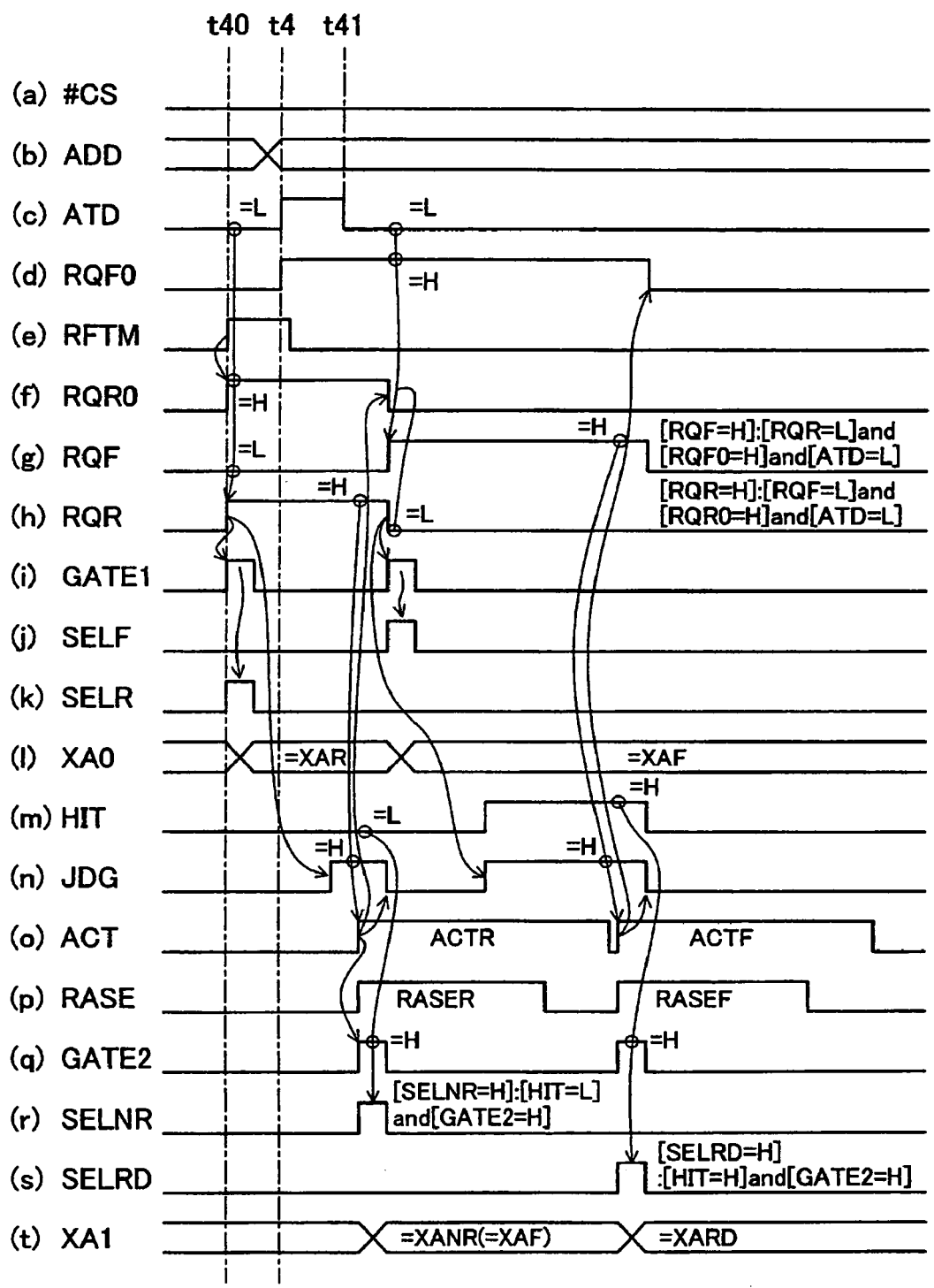
FIG. 11 is a timing chart showing a case where the refresh access and the read access are consecutively executed in operation mode.

FIG. 11 is a timing chart showing the case of refresh access and read access consecutively executed. It should be noted that as described above, the chip select signal #CS (FIG. 11(a)) is set to L level (inactive) in operation mode. Further, for the sake of description, there are shown redundancy judgment in refresh access in terms of the case of no redundant hit and redundancy judgment in read access in terms of the case of the redundant hit.

The rise-up edge of the ATD signal (FIG. 11(c)) is formed at time t4, corresponding to a change in the address ADD (FIG. 11(b)). And corresponding to the rise-up edge of the ATD signal, the source external access request signal RQFO (FIG. 11(d)) is set to H level (active).

Further, at time t40 prior to the time t4, the rise-up edge of the RF signal RFTM (FIG. 11(e)) is formed. And corresponding to the rise-up edge of the RF signal RFTM, the source RF request signal RQRO (FIG. 11(f)) is set to H level (active).

Since the source RF request signal RQRO is set to H level prior to an H level setting of the external access request signal RQFO, the RF request signal RQR (FIG. 11(h)) is set to H level (active), and the refresh access is executed at the same timing as the case of normal refresh access (FIG. 10).

At this point, if the ATD signal trails to L level at time t41 after the source external access request signal RQFO is set to H level, and if it is assumed to be the same as the case of normal read access (FIG. 9), then the external access request signal RQF (FIG. 11(g)) is supposed to be set to H level (active) in response.

However, in the present embodiment, the RF request signal RQR has already been set to H level, so that the external access request signal RQF remains at L level (inactive) until the access execution signal ACT (FIG. 11(o)) is set to H level (active) and the RF request signal RQR returns to L level (inactive).

And when the access execution signal ACT is set to H level and the refresh access commences, the RF request signal RQR is returned to L level. In response, the external access request signal RQF (FIG. 11(g)) is set to H level.

When the external access request signal RQF is set to H level, in the same way as the case of normal read access (refer to FIG. 8 or FIG. 9), in response, a pulse signal which will be at H level (active) for the fixed period is set in the address selective gate signal GATE1 (FIG. 11(i)). Corresponding to a change in the address selective gate signal GATE1, the external address selective signal SELF (FIG. 11(j)) is set to H level (active) for the fixed period.

When the external address selective signal SELF changes for the fixed period, the external X address XAF is set in the selective X address XAO (FIG. 11(l)). And the RF execution signal ACTR is outputted as the access execution signal ACT (FIG. 11(o)), whereas redundancy judgment of the RF execution signal ACTR, which has been set as the selective X address XAO, commences while the refresh access is being executed.

Upon completion of the redundancy judgment, the redundancy judgment completion signal JDG (FIG. 11(n)) is set to H level (active). Further, the judgment result is outputted as the redundancy detection signal HIT (FIG. 1(m)). As illustrated, at this point, the redundancy detection signal HIT has changed to H level (active), showing the case of having the redundant hit.

When the redundancy judgment completion signal JDG is set to H level, in the case of normal read access (FIG. 9), the un-illustrated external access execution signal ACTF responds to be set to H level (active) for the fixed period and outputted as the access execution signal ACT (FIG. 11(o)). At the same time, the external access word line activation signal RASEF is set to H level for a shorter period than the external access execution signal ACTF and is supposed to be outputted as the word line activation signal RASE (FIG. 11(p)).

However, in the case of the embodiment, the un-illustrated RF execution signal ACTR is already set to H level (active) for the fixed period and outputted as the access execution signal ACT. While, at the same time, outputting the external access execution signal ACTF as the access execution signal ACT, so that the external access word line activation signal RASEF cannot be outputted as the word line activation signal RASE.

Accordingly, in this case, it is waited until the access execution signal ACT is retuned to L level as the RF execution signal ACTR is retuned to L level (inactive). Then, the external access execution signal ACTF is set to H level for the fixed period and outputted as the access execution signal ACT, while, at the same time, the external access word line activation signal RASEF is set to H level for a shorter period than the external access execution signal ACTF and outputted as the word line activation signal RASE.

It should be noted that as regards the redundant address selective gate signal GATE 2 (FIG. 11(q)), the standard address selective signal SELNR (FIG. 11(r)), the redundant address selective signal SELRD (FIG. 11(s)), and the word line selection X address XA1, these are the same as the case of normal read access (FIG. 9) or the case of refresh access (FIG. 10).

As the foregoing explanation shows, when read access is executed by making refresh access consecutively, during execution of the refresh access, redundancy judgment corresponding to the read access is executed beforehand in parallel, so that upon completion of the refresh access, the read access is immediately executed.

It should be noted that even when refresh access is executed by making read access consecutively, likewise, during execution of the read access, redundancy judgment corresponding to the refresh access is executed beforehand in parallel, so that upon completion of the read access, the refresh access is immediately executed.

B3. Effect of First Embodiment

Figure 12A:
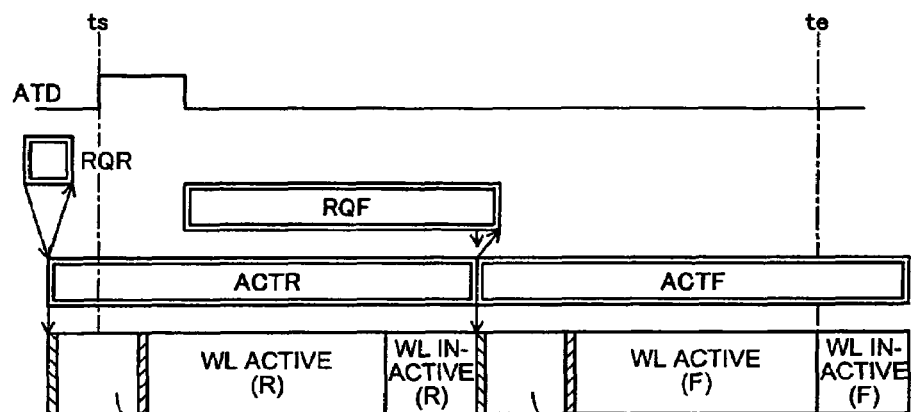
FIG. 12 is an explanatory diagram showing effect of a first embodiment.
Figure 12B:
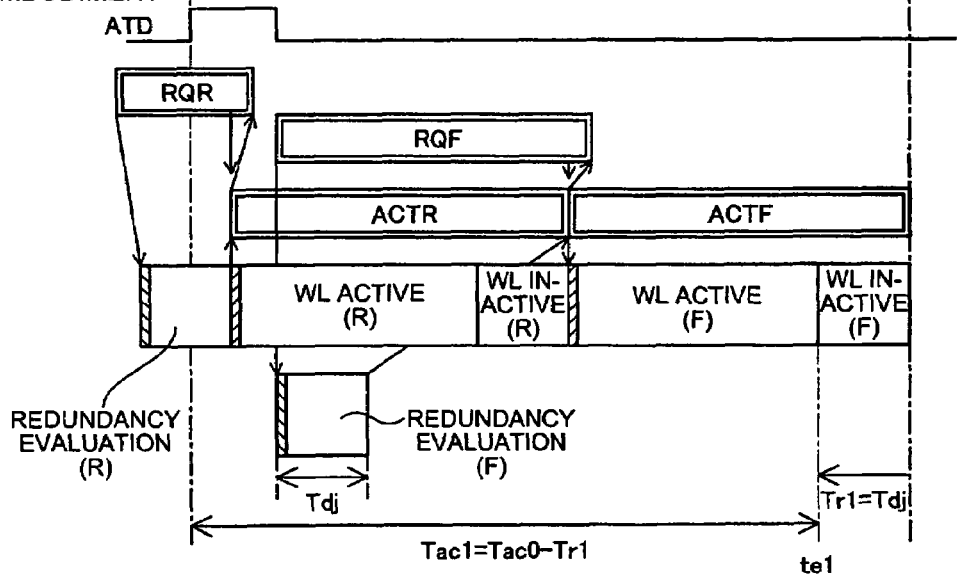

FIG. 12 is an explanatory diagram showing the effect of the first embodiment. FIG. 12B shows a flow of access operation in the case of executing read access following refresh access in the embodiment. FIG. 12A shows its comparison example.

The flow of access is shown from left to right with time ts when the rise-up edge of the ATD signal is formed as the criterion. Further, rectangles shown in double-line frames indicate periods (periods shown as active) where respective corresponding signals generate.

As shown in FIG. 12A, in the case of the comparison example, when the RF request signal RQR generates, the RF execution signal ACTR generates, and while the RF execution signal ACTR is generating, processing is carried out in order of redundancy judgment, word line (WL) activation, and WL inactivation, thus executing the refresh access.

Upon completion of the refresh access, while the RF execution signal ACTR is generating, the external access execution signal ACTF generates, according to the external access request signal RQF which generated corresponding to the trailing edge of the ATD signal. And while the external access execution signal ACTF is generating, the processing is carried out in order of redundancy judgment, word line (WL) activation, and WL inactivation, thus executing the read access.

On the other hand, as shown in FIG. 12B, in the case of the first embodiment, when the RF request signal RQR generates, in response, redundancy judgment is first executed. Then when the redundancy judgment is completed, the RF execution signal ACTR generates, and while the RF execution signal ACTR is generating, the processing is carried out in order of word line (WL) activation, and WL inactivation, thus executing the refresh access.

Further, if the external access request signal RQF generates corresponding to the trailing edge of the ATD signal while the RF execution signal ACTR is generating, in response, redundancy judgment for the read access is executed, in parallel to the processing which is carried out, while the RF execution signal ACTR is generating, in order of word line (WL) activation, and WL inactivation.

And upon completion of the refresh access, the external access execution signal ACTF generates. And, while the external access execution signal ACTF is generating, the processing is carried out in order of word line (WL) activation, and WL inactivation, thus executing the read access.

It should be noted that hatching portions in the diagram indicate time settings of addresses for redundancy judgment and time settings for addresses corresponding to WL.

In the comparison example, time Tac0 is a period (hereinafter referred to as "access time") from the rise-up of the ATD signal at the time ts to the completion of activating WL at time te during the generation of the external access execution signal ACTF. On the other hand, in the first embodiment, access time Tac1 is a period from the rise-up of the ATD signal at the time ts to the completion of activating WL at time te during the generation of the external access execution signal ACTF. The Tac1 becomes shorter than Tac0 by a time Tr1.

It should be noted that this shortened time Tr1 corresponds to Tdj which is a sum (hereinafter referred to as "redundancy judgment time for read access") of time required for the redundancy judgment for read access and address setting time for redundancy judgment. This enables, in the first embodiment, the read access time to be made shorter than the case of the comparison example.

C. Second Embodiment

A memory chip of the second embodiment is the same as the first embodiment except a different timing when the refresh access and the read access are consecutively executed in operation mode. Accordingly, this difference will be described below.

C1. Case of Refresh Access and Read Access Consecutively Executed

Figure 13:
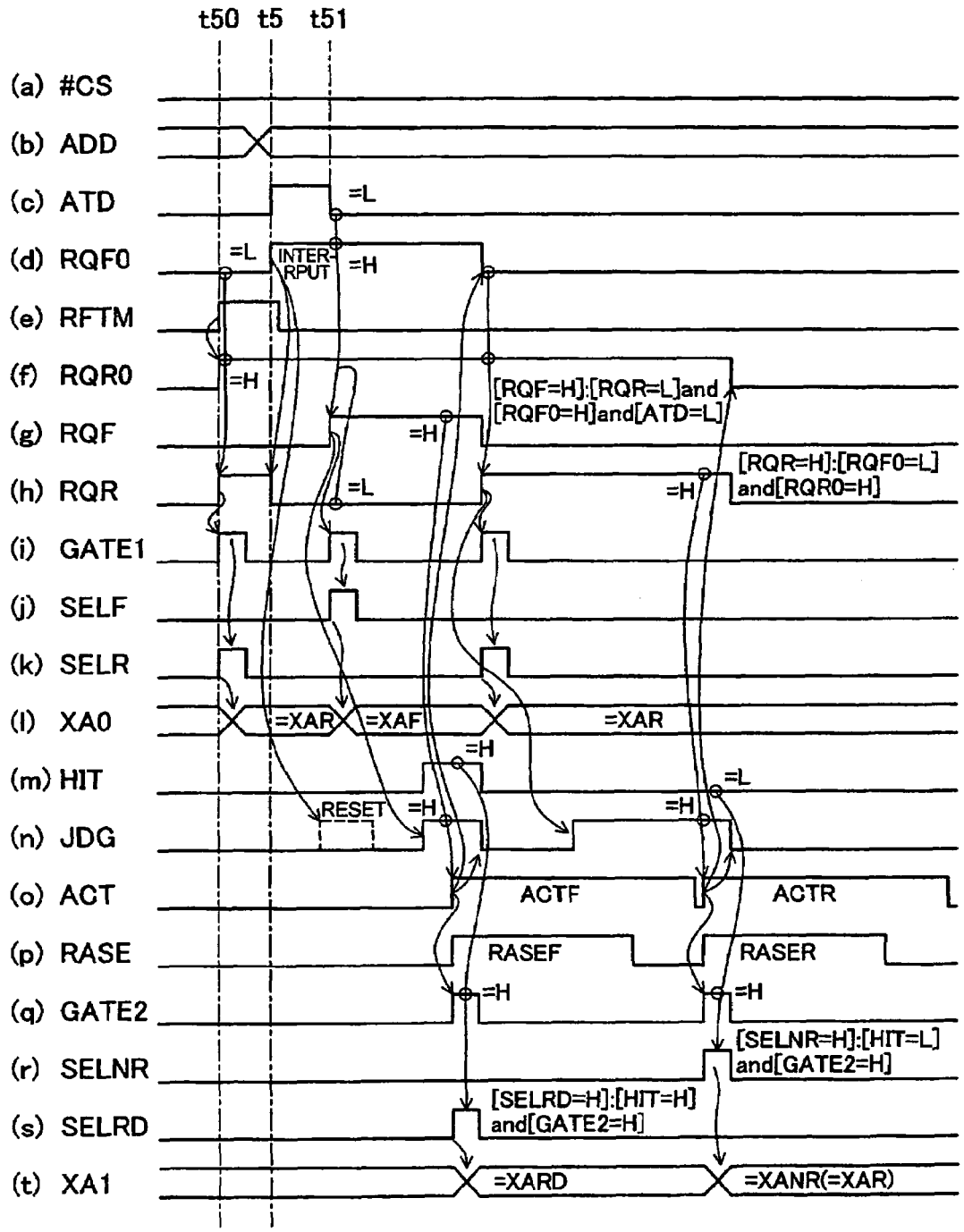
FIG. 13 is a timing chart showing a case where the refresh access and the read access are consecutively executed in operation mode.

FIG. 13 is a timing chart showing the case of the refresh access and the read access consecutively executed in operation mode. As described above, in operation mode, the chip select signal #CS (FIG. 13(a)) is set to L level. Further, for the sake of explanation, the redundancy judgment in the refresh access is shown in the case of no redundant hit, while the redundancy judgment in the read access is shown in the case of the redundant hit.

At time t5, corresponding to a change in the address ADD (FIG. 13(b)), the rise-up edge of the ATD signal (FIG. 13(c)) is formed. And, corresponding to the rise-up edge of the ATD signal, the source external access request signal RQFO (FIG. 13(d)) is set to H level (active).

Further, at time t50 prior to the time t5, the rise-up edge of the RF signal RFTM (FIG. 13(e)) is formed. And corresponding to the rise-up edge of the RF signal RFTM, the source RF request signal RQRO (FIG. 13(f)) is set to H level (active).

It should be noted that a relationship among the time t5, the time t50, and time t51 is the exactly the same as a relationship among time t4, time t40, and time t41 in the case of executing the refresh access and the read access consecutively in the first embodiment (FIG. 11), and a relationship between a timing of setting the source external access request signal RQFO at H level and a timing of setting the source RF request signal RQRO at H level is also exactly the same.

Since the source RF request signal RQRO is set to H level prior to the source external access request signal RQFO is set to H level, the RF request signal RQR (FIG. 13(h)) is set to H level (active), while the RF address XAR is set in the selective X address XAO (FIG. 13(l)). And the redundancy judgment of the RF address XAR set as the selective X address XAO commences.

It should be noted that in this example, the RF request signal RQR is set to H level, provided that the source RF request signal RQRO is at H level and the source external access request signal RQFO is at L level (inactive). Accordingly, prior to completion of the redundancy judgment, that is, when, at the time 5 prior to the redundancy judgment completion signal JDG (FIG. 13(n)) changes to H level (active), the ATD signal rises up to H level and the source external access request signal RQFO changes to H level, the RF request signal RQR responds to be returned to L level, while, at the same time, the redundancy judgment is suspended to be rest.

And, when, at the time 51, the ATD signal trails to L level, the external access request signal RQF (FIG. 13(g)) responds to be set to H level (active) and read access is executed at the same timing as in the case of the normal read access (refer to FIG. 9).

As the access execution signal ACT (FIG. 13(o)), the external access execution signal ACTF is outputted. While the read access is being executed, the redundancy judgment of the RF address XAR set as the selective X address XAO commences.

Upon completion of the redundancy judgment, the redundancy judgment completion signal JDG (FIG. 13(n)) is set to H level (active). Further, the judgment result is outputted as the redundancy detection signal HIT (FIG. 13(m)). As illustrated, at this point, the redundancy detection signal HIT is at L level (inactive), showing the case of no redundant hit.

When the redundancy judgment completion signal JDG is set to H level, the un-illustrated access execution signal ACTR responds to be set to H level (active) for the fixed period and outputted as the access execution signal ACT (FIG. 13(o)). At the same time, the RF access word line activation signal RASER is set to H level for a shorter period than the external access execution signal ACTF and is supposed to be outputted as the word line activation signal RASE (FIG. 11(p)).

However, in the case of the embodiment, the un-illustrated RF execution signal ACTF is already set to H level (active) for the fixed period and outputted as the access execution signal ACT, while, at the same time, outputting the RF execution signal ACTR as the access execution signal ACT, so that the RF word line activation signal RASER cannot be outputted as the word line activation signal RASE.

Accordingly, in this case, it is waited until the access execution signal ACT is retuned to L level as the RF execution signal ACTF is returned to L level (inactive). Then, the external access execution signal ACTR is set to H level for the fixed period and outputted as the access execution signal ACT, while, at the same time, the RF word line activation signal RASER is set to H level for a shorter period than the external access execution signal ACTF and outputted as the word line activation signal RASE.

It should be noted that as regards the redundant address selective gate signal GATE 2 (FIG. 13(q)), the standard address selective signal SELNR (FIG. 13(r)), the redundant address selective signal SELRD (FIG. 13(s)), and the word line selection X address XA1 (FIG. 13(t)), these are the same as the case of the normal read access (FIG. 9) or the case of the refresh access (FIG. 10) mentioned above.

As the foregoing explanation shows, when an external access request (read access request) generates while redundancy judgment for refresh access is being executed in operation mode, the redundancy judgment is suspended, whereas redundancy judgment corresponding to read access as well as read access are given preference and executed. And, while the read access is being executed, the redundancy judgment for the refresh access is again executed. Upon completion of the read access, the refresh access is immediately executed.

C2. Effect of Second Embodiment

Figure 14A:
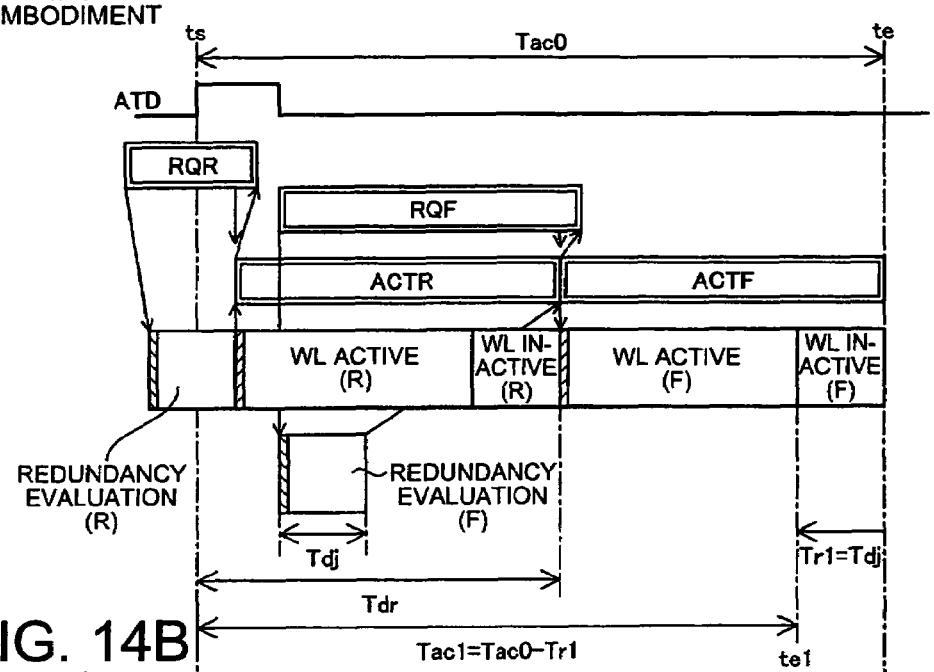
FIG. 14 is an explanatory diagram showing effect of a second embodiment.
Figure 14B:
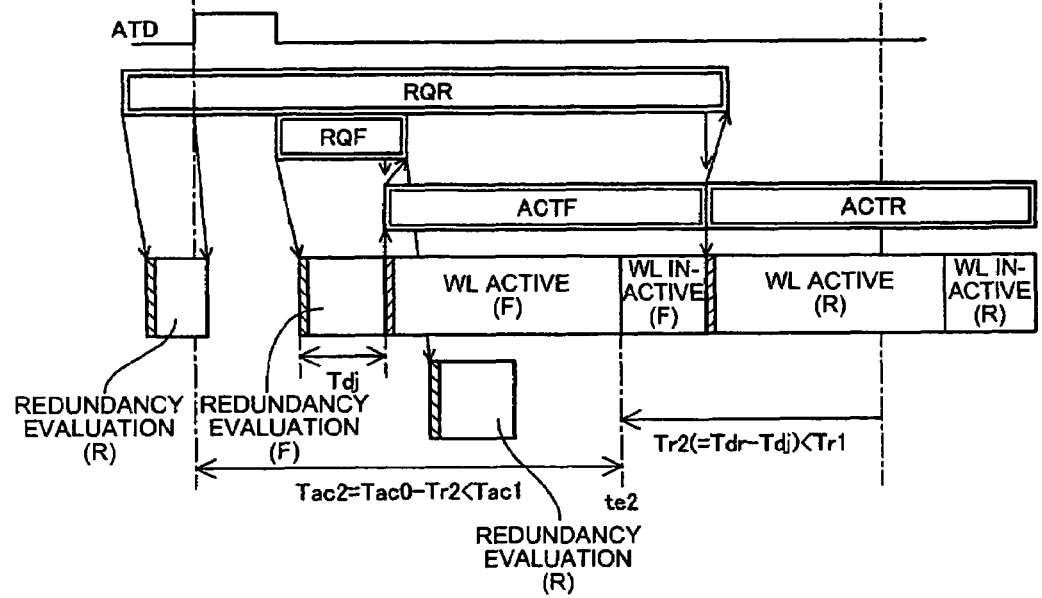

FIG. 14 is an explanatory diagram showing the effect of the second embodiment. FIG. 14A shows a flow of the processing in which the read access and the refresh access is executed consecutively, showing the same flow of the processing as FIG. 12 B in the first embodiment. FIG. 14B shows a flow of the processing in the second embodiment, in which the read access is given preference and executed.

The flow of the processing is shown from left to right with referring to the time ts, when the rise-up edge of the ATD signal is formed, as the criterion. Further, the time te shows completion time of WL activation in the comparison example shown in FIG. 12A, while time Tac0 shows access time in the comparison example. Further, a rectangle shown in a frame of double line indicates a period (active period) in which respectively corresponding signals generate.

As shown in FIG. 14A, in the case of the first embodiment, when the RF request signal RQR generates, first, the redundancy judgment responds to be executed. And upon completion of the redundancy judgment, the RF execution signal ACTR generates. While the RF execution signal ACTR is generating, the processing is executed in order of WL activation and inactivation and the refresh access is executed.

Further, if the external access request signal RQF generates corresponding to the trailing edge of the ATD signal while the RF execution signal ACTR is generating, the redundancy judgment for the read access responds to be executed in parallel to the processing of WL activation and WL inactivation which are executed while the RF execution signal ACTR is generating. And upon completion of the refresh access, the external access execution signal ACTF generates, and the processing of WL activation and WL inactivation is executed while the external access execution signal ACTF is generating, thereby executing the read access.

On the other hand, as shown in FIG. 14B, in the case of the second embodiment, when the RF request signal RQR generates, the redundancy judgment for the refresh access responds to be executed. If the ATD signal rises up during that process, that redundancy judgment is suspended. And the ATD signal trails down and the external access request signal RQF generates, then, the redundancy judgment for the read access responds to be executed.

And when the redundancy judgment for the read access is completed, the external execution signal ACTF generates. While the external execution signal ACTF is generating, processing is executed in order of word line (WL) activation and WL inactivation, thus executing the read access.

Further, the redundancy judgment for the refresh access is again executed in parallel to the processing which is carried out in order of word line (WL) activation and WL inactivation, while the external access execution signal ACTF is generating, And upon completion of the read access, the RF execution signal ACTR generates. And, while the RF execution signal ACTR is generating, the processing is carried out in order of word line (WL) activation, and WL inactivation, thus executing the refresh access.

It should be noted that the hatching portions in the diagram indicate time settings of addresses the for redundancy judgment and time settings for addresses corresponding to WL.

In the second embodiment, access time Tac2 is a period from the rise-up of the ATD signal at the time ts to the completion of activating WL at time te2 during the generation of the external access execution signal ACTF. The time Tac2 becomes shorter by a shortened time Tr2 due to preference given to the read access with respect to the access time Tac0 in the comparison example.

Further, this shortened time Tr2 corresponds to time, which is obtained by subtracting the redundancy judgment time Tdj for the read access from time Tdr which is from time ts up to the generation of the external access execution signal ACTF in the first embodiment. And it becomes longer than the shortened time Tr1 in the first embodiment. Consequently, the access time Tac2 in the second embodiment in this case becomes even shorter than the access time Tac1 in the first embodiment.

It should be noted that in the second embodiment, too, in the case where an external access request generates during a period in which a refresh access is being executed due to generation of the RF execution signal ACTR after completion of redundancy judgment for the refresh access, no preference is given to the read access. In the same way as the first embodiment, the processing is executed in order of the refresh access and the read access.

However, the condition for the redundancy judgment for the refresh access not to be suspended is the case for the redundancy judgment to be completed by the time the ATD signal rise up to H level.

In the case where the redundancy judgment for the refresh access is suspended, as mentioned above, preference is given to the read access, so that the access time becomes shorter than the case where no preference is given to the read access. As a result, a worst case of the access time in the read access is when the redundancy judgment completes immediately prior to the ATD signal rises up to H level, thus executing the refresh access in advance.

On the other hand, in the case of the first embodiment, even if the redundancy judgment does not complete prior to the rise-up of the ATD signal, the refresh access is executed in advance, so that the worst case of the access time in the first embodiment is: the refresh request signal RQR generates immediately before the rise-up of the ATD signal, thereby executing the refresh access. Consequently, in the second embodiment, it is possible to shorten the access time more than the case of the first embodiment.

D. Application Example to Electronic Equipment

Figure 15:
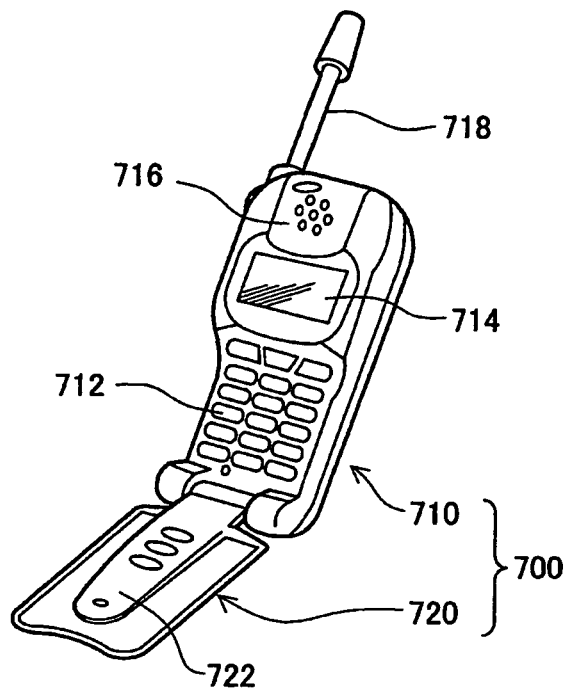
FIG. 15 is a perspective view of a mobile phone as a embodiment of electronic equipment using a semiconductor memory device according to the invention.

FIG. 15 is a perspective view of a mobile phone as an embodiment of electronic equipment using a semiconductor memory device according to the invention. This mobile phone 700 is composed of a body 710 and a cover 720. On the body 710 are provided a keyboard 712, a liquid crystal display 714, a receiver 716, and a body antenna 718. Further, a speaker 722 is provided on the cover 720.

Figure 16:
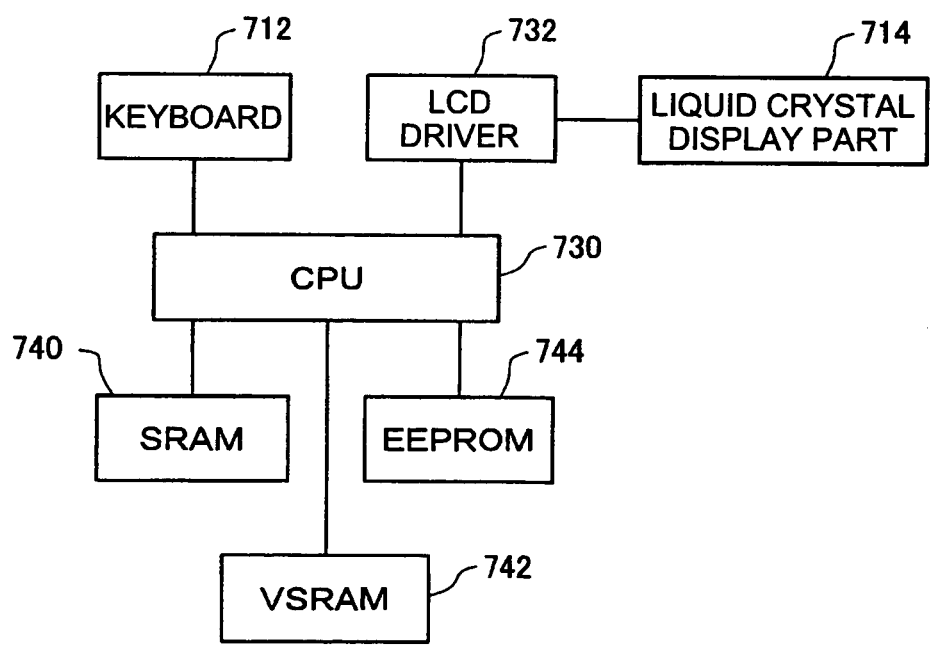
FIG. 16 is a block diagram showing an electrical configuration of a mobile phone 700 of FIG. 15.
Figure 17A:
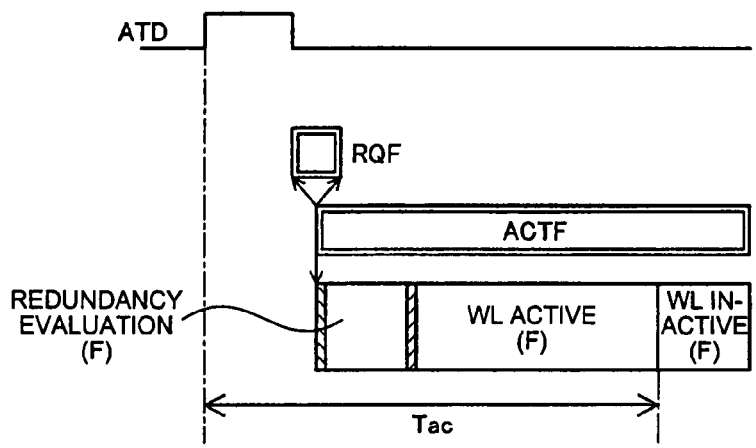
FIG. 17 is an explanatory diagram showing a flow of access processing in a virtual SRAM using redundant technology.
Figure 17B:
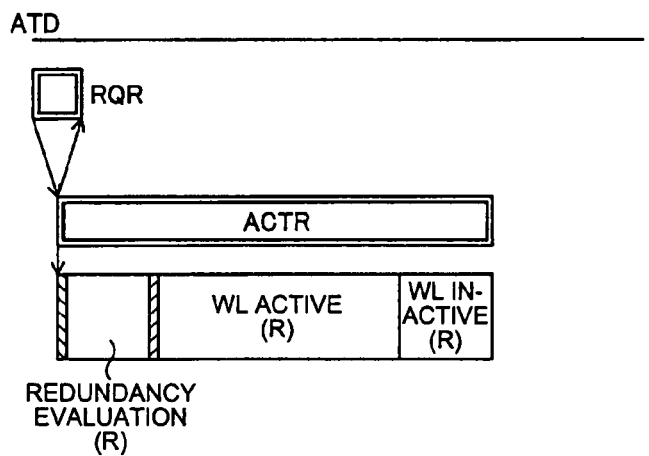
Figure 17C:
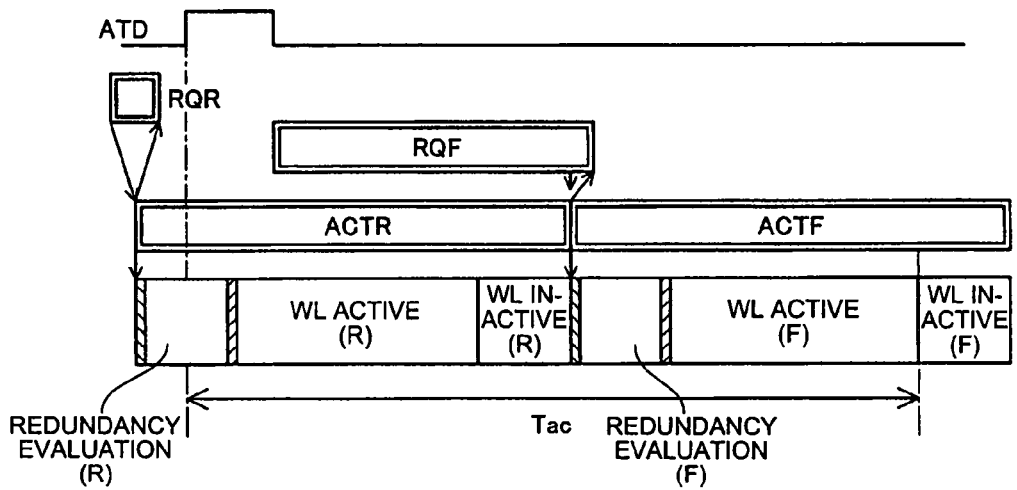

FIG. 16 is a block diagram showing an electrical configuration of the mobile phone of FIG. 15. To a CPU 730 are connected through a bus line a keyboard 712, an LCD driver 32 for driving the crystal display, an SRAM 740, a VSRAM 742, and an EEPROM 744.

The SRAM 740 is used, for example, as a high-speed cache memory. Further, the VSRAM 742 is used, for example, as a work memory for image processing. For this VSRAM 742 (referred to as a "pseudo SRAM" or a "virtual SRAM"), the above-mentioned memory chip 100 may be employed. The EEPROM 744 is used to store various settings of the mobile phone 700.

When stopping operation of the mobile phone 700 temporarily, the VSRAM 742 can be maintained at standby. In this way, the VSRAM 742 executes an internal refresh automatically, hence, this enables data in the VSRAM 742 to be held without vanishing.

Especially, since the memory chip 100 of this embodiment has a comparatively large volume, there is an advantage of being able to keep holding a large quantity of data such as image data. Further, there is another advantage in that the memory chip 100 of this embodiment does not need to be conscious of refresh operation, so that it can be used in the same way as the SRAM.

E. Modification

Further, the invention is not limited to the above-mentioned embodiments and embodiments. Many modifications and variations are possible within the scope and spirit of the invention. For example, the following variations are possible.

In the above-mentioned second embodiment, there is shown an example whereby the read access is given preference and executed, while the redundancy judgment for the refresh access is executed in parallel thereto, so that, upon execution of the read access, the refresh access is immediately executed. But it may be arranged such that the redundancy judgment for the refresh access is executed after the read access is executed, then the refresh access is executed. In this case, too, it is possible to shorten access time as compared to the case of the above-mentioned comparison example.

Further, in the above-mentioned embodiment, the ATD circuit (FIG. 4) is provided and the external access operation with the ATD signal as the criterion is executed. Instead, clock signals may be supplied from an external device.

What is claimed is:

1. A semiconductor memory device, comprising:
a memory cell array having a standard memory cell array part in which dynamic memory cells are arranged in a matrix pattern, and a redundant memory cell array having a redundant memory cell set up to replace a defective memory cell in the standard memory cell array part;
an access control part controlling external access operation and refresh access operation regarding the memory cell array; and
a redundancy judgment circuit executing redundancy judgment for the external access operation and the refresh access operation to determine whether a subjected memory cell is the redundant memory cell or not, controlling so as to access the redundant memory cell if the subjected memory cell is the redundant memory cell, and controlling so as to access the memory cell in the standard memory cell array if the subjected memory cell is not the redundant memory cell, wherein the refresh access operation is executed according to generation of a refresh access request indicating a start of the refresh access operation,
an external access request indicating a start of the external access operation generates during a time from start of a redundancy judgment for the refresh access operation until completion of the refresh access operation, and
the access control part makes the redundancy judgment circuit execute the redundancy judgment for the external access operation in parallel to the refresh access operation, and execute the external access operation after completion of the refresh access operation.

2. The semiconductor memory device according to claim 1, wherein the external access request generates during execution of the redundancy judgment for the refresh access operation, and the access control part stops the redundancy judgment for the refresh access operation and makes the redundancy judgment circuit execute the redundancy judgment for the refresh access operation according to generation of the external access request, thereafter executing the external access operation, while, at the same time, making the redundancy judgment circuit execute again the redundancy judgment for the external refresh access operation in parallel to the external access operation, so as to make the redundancy judgment circuit execute the refresh access operation upon completion of the external access operation.

3. A semiconductor memory device, comprising:
  a memory cell array having a standard memory cell array part in which dynamic memory cells are arranged in a matrix pattern, and a redundant memory cell array having a redundant memory cell set up to replace a defective memory cell in the standard memory cell array part;
  an access control part controlling external access operation and refresh access operation regarding the memory cell array; and
  a redundancy judgment circuit controlling so as to access the redundant memory cell if a subjected memory cell is the redundant memory cell, and controlling so as to access the memory cell in the standard memory cell array if the subjected memory cell is not the redundant memory cell, wherein,
  redundancy judgment for the refresh access operation is executed by the redundancy judgment circuit, the refresh access operation is executed according to generation of a refresh access request indicating a start of refresh access operation, an external access request indicating the start of the external access operation generates during execution of the redundancy judgment for the refresh access operation, and the access control part stops the redundancy judgment for the refresh access operation, while making the redundancy judgment circuit execute redundancy judgment for the external access operation according to the generation of the external access request.

4. Electronic equipment upon which is mounted the semiconductor memory device according to claim 1.

5. An access control method for controlling an external access operation and a refresh access operation in a semiconductor memory device, the semiconductor memory device including:
  a memory cell array having a standard memory cell array part in which memory cells of a dynamic type are arranged in a matrix pattern, and a redundant memory cell array having a redundant memory cell set up to replace a defective memory cell in the standard memory cell array part;
  an access control part controlling external access operation and refresh access operation regarding the memory cell array; and
  a redundancy judgment circuit controlling so as to access the redundant memory cell if a subjected memory cell is the redundant memory cell, and controlling so as to access the memory cell in the standard memory cell array if the subjected memory cell is not the redundant memory cell, the method comprising:
  executing redundancy judgment for the refresh access operation by the redundancy judgment circuit and the refresh access operation according to generation of a refresh access request indicating the start of the refresh access operation;
  generating an external access request indicating a start of the external access operation during a time from start of redundancy judgment for the refresh access operation until completion of the refresh access operation; and
  making the redundancy judgment circuit execute the redundancy judgment for the external access operation in parallel to the refresh access operation, and execute the external access operation after completion of the refresh access operation.

6. An access control method for controlling an external access operation and a refresh access operation in a semiconductor memory device, the semiconductor memory device including:
  a memory cell array having a standard memory cell array part in which dynamic memory cells are arranged in a matrix pattern, and a redundant memory cell array having a redundant memory cell set up to replace a defective memory cell in the standard memory cell array part;
  an access control part controlling external access operation and refresh access operation regarding the memory cell array; and
  a redundancy judgment circuit controlling so as to access the redundant memory cell if a subjected memory cell is the redundant memory cell, and controlling so as to access the memory cell in the standard memory cell array if the subjected memory cell is not the redundant memory cell, the method comprising:
  generating the external access request indicating a start of the external access operation during execution of the redundancy judgment for the refresh operation;
  executing the redundancy judgment for the refresh access operation by the redundancy judgment circuit and the refresh access operation according to generation of a refresh access request indicating a start of refresh access operation; and
  stopping the redundancy judgment for the refresh access operation, while making the redundancy judgment circuit execute redundancy judgment for the external access operation according to the generation of an external access request.

* * * * *